(12) United States Patent
Gibson

(10) Patent No.: US 12,290,008 B2
(45) Date of Patent: Apr. 29, 2025

(54) SCALED QUANTUM CIRCUITS

(71) Applicant: International Business Machines Corporation, Armonk, NY (US)

(72) Inventor: Gerald W. Gibson, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 742 days.

(21) Appl. No.: 17/553,159

(22) Filed: Dec. 16, 2021

(65) Prior Publication Data

US 2023/0200260 A1 Jun. 22, 2023

(51) Int. Cl.
*H10N 60/12* (2023.01)
*G06N 10/40* (2022.01)
*H10N 60/80* (2023.01)

(52) U.S. Cl.
CPC ............ *H10N 60/12* (2023.02); *G06N 10/40* (2022.01); *H10N 60/805* (2023.02)

(58) Field of Classification Search
None
See application file for complete search history.

(56) References Cited

U.S. PATENT DOCUMENTS

| | | | |
|---|---|---|---|
| 8,853,544 B2 | 10/2014 | Kondou et al. | |
| 10,665,769 B2 | 5/2020 | Caudillo et al. | |
| 10,770,638 B2 | 9/2020 | Megrant | |
| 10,840,296 B2 | 11/2020 | Rosenblatt et al. | |
| 11,568,299 B1 * | 1/2023 | Fork | G06N 10/00 |
| 2018/0366634 A1 * | 12/2018 | Mutus | H01L 25/18 |
| 2019/0385673 A1 | 12/2019 | Bosman et al. | |
| 2020/0265334 A1 | 8/2020 | Haider et al. | |

FOREIGN PATENT DOCUMENTS

WO 2021146028 7/2021

* cited by examiner

*Primary Examiner* — Michelle Mandala
(74) *Attorney, Agent, or Firm* — Amin, Turocy & Watson, LLP

(57) ABSTRACT

Techniques for forming respective groups of quantum circuit elements (QCEs) on respective crystalline surfaces of a crystalline dielectric (CD) layer are presented. Vias can be formed in the CD layer. Second QCEs can be formed on a second crystalline surface of the CD layer. A seal layer can be applied to the patterned second metallization layer that forms the second QCEs. A handle wafer can be bonded to the seal layer. The chip stack can be turned over to place a substrate at the top, and handle wafer at the bottom, of the chip stack. The substrate and a buried oxide layer can be removed to expose the first crystalline surface of the CD layer. First QCEs can be formed on the first crystalline surface of the CD layer. A portion of the first QCEs can be coupled or interconnected to a portion of the second QCEs.

20 Claims, 18 Drawing Sheets

SCALED QUANTUM CIRCUITS

BACKGROUND

The subject disclosure relates to quantum circuitry, and more specifically, to scaled quantum circuits. Quantum circuits can comprise qubits, Josephson junctions (e.g., of qubits), superconducting quantum interference device (SQUID) loops, resonators, capacitors (e.g., qubit shunt capacitors and/or other capacitors), inductors, and/or other quantum circuit components, quantum circuit elements, or circuitry. Some existing techniques for fabricating Josephson junction-based superconducting qubit circuits can utilize coplanar waveguides for signal lines, resonators, and quantum buses, and proximate areas of thin metal films coupled through the substrate for qubit shunt capacitors.

One existing approach to forming quantum circuits relates to quantum circuit assemblies implementing vertically-stacked parallel-plate capacitors. Such capacitors include first and second capacitor plates which are parallel to one another and separated from one another by a gap measured along a direction perpendicular to the qubit plane, i.e., measured vertically. The gap between the first and second capacitor plates may refer to a separation or an opening between two planar conductors, typically superconductors, implementing the first and second capacitor plates, which opening may include air, some other gas or combination of gasses, may be filled with a liquid or a solid dielectric material, or may be a substantially vacuum opening.

Another existing approach for forming quantum circuits can involve providing a first wafer including a first substrate, a first insulator layer on the first substrate, and a first dielectric layer on the first insulator layer; providing a second wafer including a second substrate, a second insulator layer on the second substrate, and a second dielectric layer on the second insulator layer; forming a first superconductor layer on the first dielectric layer; forming a second superconductor layer on the second dielectric layer; joining a surface of the first superconductor layer to a surface of the second superconductor layer to form a wafer stack; and forming a third superconductor layer on an exposed first surface of the first dielectric layer.

Still another existing approach for forming quantum circuits can involve a superconductor structure that can comprise a first wafer comprising a first silicon layer attached to a first patterned superconducting layer, and a second wafer comprising a second silicon layer attached to a second patterned superconducting layer. The second patterned superconducting layer of the second wafer can be attached to the first patterned superconducting layer of the first wafer.

The above-described background description is merely intended to provide a contextual overview regarding quantum circuitry and is not intended to be exhaustive.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, methods, apparatuses, and/or computer program products that can facilitate designing, fabricating, and/or utilizing desirably scalable quantum circuits, comprising quantum circuit components and elements, are presented.

According to an embodiment, a device can comprise a first group of quantum circuit elements on a first crystalline surface of a crystalline dielectric layer. The system also can comprise a second group of quantum circuit elements on a second crystalline surface of the crystalline dielectric layer, wherein the first group of quantum circuit elements is coupled to the second group of quantum circuit elements. Such embodiments of the device can provide a number of advantages, including that the device can comprise quantum circuit components and elements that can be desirably reduced in size.

In some embodiments, the device can comprise: a capacitor, wherein the first group of quantum circuit elements can comprise a first plate of the capacitor, wherein the second group of quantum circuit elements can comprise a second plate of the capacitor, wherein the crystalline dielectric layer can be situated between the first plate and the second plate, wherein the first crystalline surface can interface with the first plate, wherein the second crystalline surface can interface with the second plate, and wherein the first plate can be coupled to the second plate. In still other embodiments, the device can further comprise that the crystalline dielectric layer can be a low loss tangent dielectric that can satisfy a defined low loss tangent criterion. In yet other embodiments, the device can further comprise that a qubit, the capacitor, an inductor, and microstrip signal lines can be situated or integrated on a single die. Such embodiments of the device can provide a number of advantages, including that the device can comprise quantum circuit components and elements that can be desirably reduced in size, can desirably increase the number and density of quantum circuit components and elements that can be fabricated and integrated on a die, and can desirably integrate desired quantum circuit components on a same die.

Another embodiment relates to a method that can comprise forming a first group of quantum circuit elements on a first crystalline surface of a crystalline dielectric layer. The device also can comprise forming a second group of quantum circuit elements on a second crystalline surface of the crystalline dielectric layer, wherein the first group of quantum circuit elements is coupled to the second group of quantum circuit elements. Such embodiments of the method can provide a number of advantages, including that the method can comprise desirably reducing the size of quantum circuit components and elements.

In some embodiments, the method also can comprise bonding a handle wafer to the second group of quantum circuit elements or a seal layer deposited on the second group of quantum circuit elements, wherein the bonding can be a metal-metal bonding, an oxide-oxide bonding, or an adhesive bonding; turning the chip stack over to invert the chip stack to place the substrate at a top end of the chip stack and the handle wafer at a bottom end of the chip stack; and removing the substrate and the buried oxide layer from the chip stack to expose the first crystalline surface of a crystalline dielectric layer. In still other embodiments, the method can comprise depositing a first metallization layer on the first crystalline surface of the crystalline dielectric layer; and patterning the first metallization layer to form the first group of quantum circuit elements on the first crystalline surface, wherein a first portion of the first group of quantum circuit elements can be coupled or interconnected to a second portion of the second group of quantum circuit elements. Such embodiments of the method can provide a number of advantages, including that the method can desirably enable the first group of quantum circuit elements and the second group of quantum circuit elements to be formed on respective crystalline surfaces on respective sides of the crystalline material-on-insulator layer.

A further embodiment relates to a system that can comprise a first group of quantum circuit elements situated on a first crystalline surface of a crystalline dielectric layer. The system also can comprise a second group of quantum circuit elements situated on a second crystalline surface of the crystalline dielectric layer, wherein the first group of quantum circuit elements is coupled to the second group of quantum circuit elements. Such embodiments of the system can provide a number of advantages, including that the system can comprise quantum circuit components and elements that can be desirably reduced in size and integrated on a same die.

These and other features will become apparent from the following detailed description of illustrative embodiments thereof, which is to be read in connection with the accompanying drawings.

DETAILED DESCRIPTION

Figure 1:
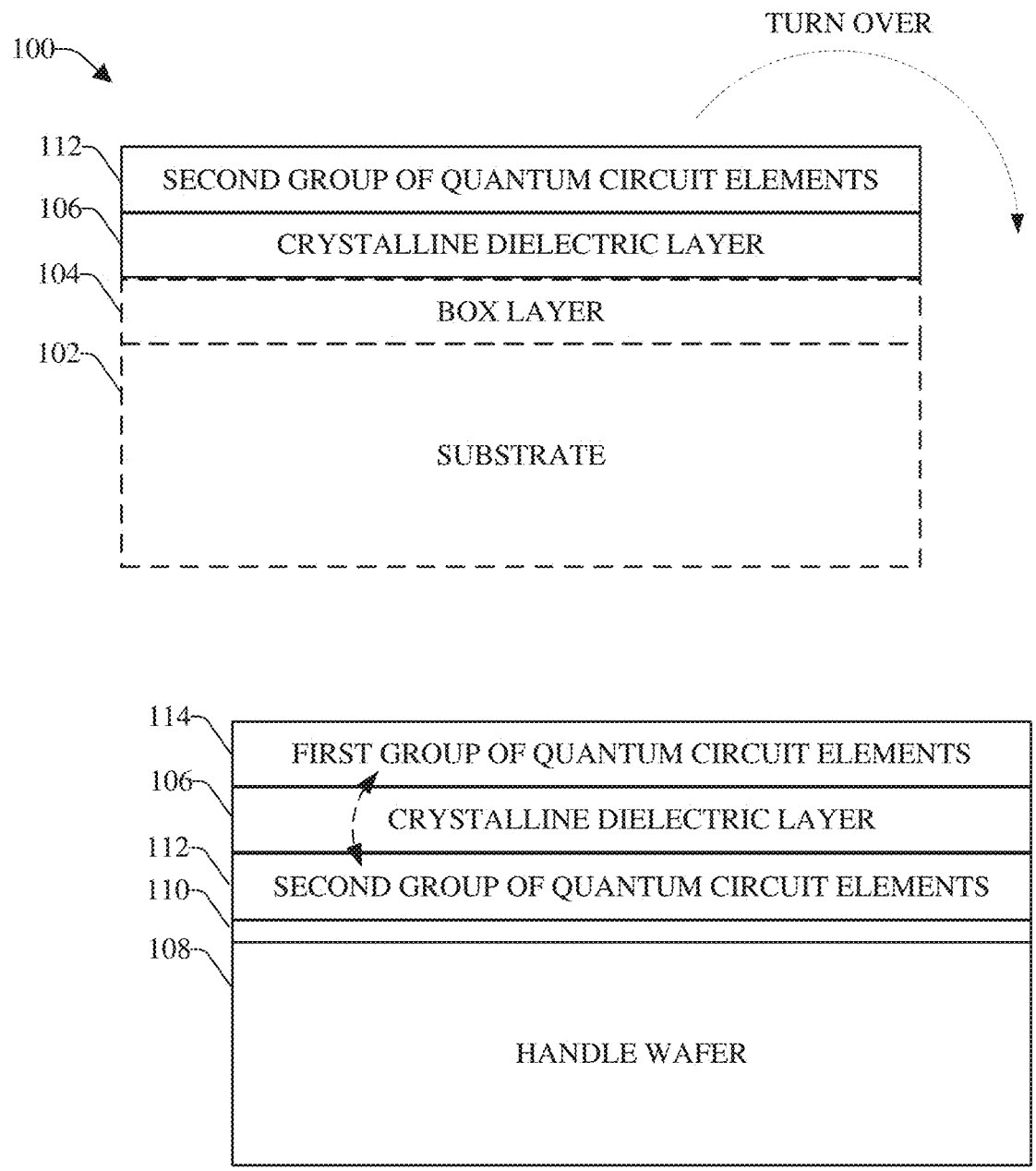
FIG. 1 illustrates a block diagram of an example, non-limiting device 100 comprising respective groups of quantum circuit elements formed on respective crystalline surfaces of a crystalline dielectric layer, in accordance with various aspects and embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computers can comprise a group of qubits that can perform quantum operations on data. Quantum circuits can comprise qubits, Josephson junctions (e.g., of qubits), superconducting quantum interference device (SQUID) loops, resonators, capacitors (e.g., qubit shunt capacitors and/or other capacitors), inductors, waveguides, and/or other quantum circuit components, elements, or circuitry. Some existing techniques for fabricating Josephson junction-based superconducting qubit circuits, which can utilize coplanar waveguides for signal lines, resonators, and quantum buses, and proximate areas of thin metal films coupled through the substrate for qubit shunt capacitors, can result in circuits with relatively low qubit density where the largest circuits that can fit within the imaging field of a standard photolithography tool contain order 100 qubits. Further, existing quantum circuitry fabrication techniques do not admit viable (e.g., cannot provide suitable) on-chip interconnects except for with regard to relatively simple quantum circuits. As a result, the implementation of quantum circuits with device counts in the 100 to 1000 qubit range can involve having to use undesirably complex packaging schemes, and scaling circuits to beyond 1000 qubits can involve having to use undesirably large and complex refrigeration systems.

A potential solution to this scaling problem may be to employ thin film parallel plate capacitors with specific capacitances ≥0.1 femtofarads (fF)/micrometers (μm)$^2$ that, when coupled with bare inductors and integrated multi-level interconnects employing strip lines and microstrip lines, could appreciably shrink quantum circuits. However, historically, this approach has not been pursued, because the loss tangents for deposited dielectrics typically can be much too large to be applied to quantum circuits.

Existing approaches, such as those described herein, relating to forming quantum circuits can have a number of deficiencies that can render them undesirable for use in fabricating higher density quantum circuits for qubit devices that can have a relatively large number of qubits and quantum circuit components and elements. For instance, existing approaches relating to forming quantum circuits can result in deficient quantum circuit performance, undesirably large quantum circuit components, insufficient scaling of quantum circuit components and quantum circuits, undesirably low density fabrication of quantum components on devices, insufficient capability to integrate quantum circuit components and circuitry on a wafer, undesirable and inefficient utilization of multiple wafers each having their own patterned superconducting layer that are attached together to form a superconductor structure in order to form a quantum circuit, undesirably complex packaging schemes for fabrication of quantum devices, and/or undesirably large and complex refrigeration systems to accommodate undesirably large quantum devices.

It can be desirable to reduce or scale down the size of quantum circuit components and elements, and accordingly, increase the number and density of quantum circuit components and elements on an integrated circuit (IC) chip, increase the performance and efficiency of quantum circuit components and elements that are desirably smaller in size, provide for desirable (e.g., suitable, sufficient, enhanced, and/or optimal) integration of quantum circuit components and elements on an IC chip, and provide for desirable coupling or interconnecting of respective quantum circuit components or elements across respective surfaces of the quantum device.

To that end, various embodiments described herein relate to techniques for designing, forming, fabricating, and/or utilizing respective groups of quantum circuit elements on respective crystalline surfaces of a crystalline dielectric layer, in accordance with various aspects and embodiments of the disclosed subject matter. In some embodiments, an initial chip stack can comprise a substrate with a buried oxide (BOX) layer formed or deposited on top of the substrate, and the crystalline dielectric layer can be formed or fabricated on top of the BOX layer, such as described herein.

The disclosed subject matter can comprise a device formation component that can form (e.g., etch) one or more vias in the crystalline dielectric layer (e.g., etch into a second crystalline surface of the crystalline dielectric layer) down to and stopping at the BOX layer. Forming the one or more vias in the crystalline dielectric layer can enable electrical access of both sides of the crystalline dielectric layer (e.g., electrical access to respective quantum circuit components or elements that be formed on the second crystalline surface and a first crystalline surface of the crystalline dielectric layer). In certain embodiments, the disclosed subject matter can employ protective layers and/or protective processes to facilitate protecting the surfaces of the crystalline dielectric layer, including protecting crystalline dielectric surfaces in connection with the forming of the one or more vias, such as described herein.

The device formation component can deposit a second metallization layer on the second crystalline surface of the crystalline dielectric layer, and can pattern the second metallization layer to form a second group of quantum circuit elements on the second crystalline surface. In some embodiments, the device formation component can apply (e.g., deposit) a seal layer to the patterned second metallization layer that forms the second group of quantum circuit elements. The device formation component can bond a handle wafer to the seal layer, such as described herein. The chip stack can be turned over (e.g., flipped over) to place the substrate at the top, and the handle wafer at the bottom, of the chip stack. The device formation component can remove (e.g., etch, grind, or polish away) the substrate and the BOX layer to expose the first crystalline surface of crystalline dielectric layer.

The device formation component can deposit a first metallization layer to the first crystalline surface of the crystalline dielectric layer, and can pattern the first metallization layer to form a first group of quantum circuit elements on the first crystalline surface. Quantum circuit elements can be quantum circuit components (e.g., qubits, Josephson junctions, SQUID loops, resonators, capacitors, inductors, electrodes, microstrip lines, connectors or lead lines, interconnects, or other components) or elements of (e.g., parts or sub-components of) quantum circuit components. As desired from the quantum circuitry of the device, desired first quantum circuit elements of the first group of quantum circuit elements formed on the first crystalline surface of the crystalline dielectric layer can be coupled (e.g., capacitively coupled) or interconnected (e.g., using superconductive interconnects formed in the vias) to desired second quantum circuit elements of the second quantum circuit elements formed on the second crystalline surface of the crystalline dielectric layer, such as more fully described herein. In certain embodiments, the qubit(s), comprising a Josephson junction(s) and shunt capacitor, the capacitor(s), the inductor(s), waveguides, the microstrip signal lines, and/or other circuitry (e.g., SQUID loops, interconnects, connector or lead lines, electrodes, capacitive couplers, or other desired quantum circuitry) can be formed or integrated on a single die (e.g., a single IC chip).

The disclosed subject matter can have a number of advantages over existing technology for fabricating quantum devices. For instance, the disclosed subject matter can desirably (e.g., suitably, usefully, enhancedly, and/or optimally) reduce the size of quantum circuit components and elements, can desirably increase the number and density of quantum circuit components and elements that can be fabricated and integrated on an IC chip of a quantum device (e.g., on the IC chip of the device), can desirably couple or interconnect quantum circuit components or elements formed on the first crystalline surface of the crystalline dielectric layer with quantum circuit components or elements formed on the second crystalline surface of the crystalline dielectric layer, can desirably integrate quantum circuit components on the same IC chip (e.g., can integrate qubits, including shunt capacitors, SQUID loops, resonators (e.g., inductors and capacitors), other capacitors (e.g., capacitive couplers), waveguides, electrodes, microstrip lines, and/or other desired quantum circuit components or elements on the same IC chip) and accordingly can reduce offloading of quantum circuit components to other IC chips.

These and other aspects and embodiments of the disclosed subject matter will now be described with respect to the drawings.

FIG. 1 illustrates a block diagram of an example, non-limiting device 100 (e.g., quantum device, qubit device, or multi-qubit device) comprising respective groups of quantum circuit elements formed on respective crystalline surfaces of a crystalline dielectric layer, in accordance with various aspects and embodiments of the disclosed subject matter. The device 100 can comprise a system of various components and circuitry that can be arranged to perform one or more desired functions, such as described herein. The device 100 (e.g., quantum device, qubit device, or multi-qubit device or package) can have dimensions (e.g., the IC chip of the device 100 can have dimensions) that can vary, wherein the length of the device 100 can range, for example, from on the order of millimeters to on the order of tens of millimeters, the width of the device 100 can range, for example, from on the order of millimeters to on the order of tens of millimeters, and the thickness can range, for example, from approximately 1 millimeter (mm) to approximately 3 mm. It is to be appreciated and understood that these dimensions of the device 100 are exemplary, and, in accordance with other embodiments, the device 100 can have different (e.g., smaller or larger) dimensions than the example dimensions described herein.

In some embodiments, as part of the formation of the device 100, the disclosed subject matter can comprise an initial chip stack that can comprise a substrate 102 with a BOX layer 104 formed or deposited on top of the substrate 102, and a crystalline dielectric (CD) layer 106 formed or fabricated on the top of the BOX layer 104, such as described herein. Initially, the substrate 102 can be on the bottom of the chip stack. The substrate 102 can be formed of a desired silicon or silicon-based material. The BOX layer 104 can be a desired oxide material (e.g., $SiO_2$) that can be buried or embedded, at least initially, between the substrate 102 and the CD layer 106. The CD layer 106 can be a desired crystalline dielectric material-on-insulator, such as, for example, silicon-on-insulator (SOI), silicon-on-sapphire (SOS), germanium-on-insulator (GOI), or other desired type of crystalline dielectric material that can satisfy a defined low loss tangent criterion, such as described herein.

A device formation component (not shown in FIG. 1; and as described herein) can process the chip stack, including the CD layer 106, to, for example, expose the crystalline surfaces of the CD layer 106 to enable metallization layers to be deposited on each of those crystalline surfaces on each side of the CD layer 106, protect the CD layer 106 during processing, form desired vias in the CD layer 106 (not shown in FIG. 1; and as described herein) for use to form interconnects to enable connections (e.g., electrical connections) between respective quantum circuit elements that can be formed on respective sides of the CD layer 106, and/or other desired processing of the chip stack, such as more fully described herein.

The device 100 can comprise a handle wafer 108 that can be associated with (e.g., bonded to) a seal layer 110, such as described herein. Prior to the handle wafer 108 and the seal layer 110 being applied to the chip stack and prior to turning the chip stack over (e.g., at a point when the substrate 102 is still on the bottom of the chip stack), the device formation component can deposit a second surface metallization layer on a second crystalline surface of the CD layer 106 and can pattern and/or etch the second metallization layer, as desired, to form a second group of quantum circuit elements 112 on the second surface metallization layer, such as more fully described herein. In some embodiments, the second group of quantum circuit elements 112 can comprise interconnects, connectors or lead lines, capacitor plates, and/or other quantum circuit elements or circuitry. In certain embodiments, in addition or alternatively, the second group of quantum circuit elements 112 can comprise a qubit(s), a Josephson junction(s) of a qubit, a SQUID loop(s), a resonator(s), a capacitor(s), an inductor(s), waveguide(s), electrode(s), and/or microstrip lines, or portions thereof (e.g., elements of a qubit; or an element, such as a plate, of a parallel plate capacitor). While one metallization layer may be deposited on this second side of the CD layer 106, as in this instance with the device 100, in some embodiments, if and as desired, the device 100 may comprise one or more additional metallization layers on this second side of the CD layer 106, such as described herein.

After the second group of quantum circuit elements 112 is formed on the second surface metallization layer, the device formation component can apply, deposit, or form the seal layer 110 on the second group of quantum circuit elements 112. The device formation component also can bond the handle wafer 108 to the seal layer 110 using a desired bonding process and/or bonding material. In accordance with various embodiments, the bond can be an adhesive bond created using a desired adhesive material, metal-metal bond, or oxide-oxide bond.

At this point, the device formation component or other component (or a user) can turn over (e.g., flip over) the chip stack such that the substrate 102 can be at the top of the chip stack and the handle wafer 108 can be at the bottom of the chip stack. The device formation component can remove (e.g., grind, etch, or polish away) the substrate 102 and BOX layer 104 to expose the first crystalline surface of the CD layer 106, such as more fully described herein. The device formation component can deposit a first surface metallization layer on the first crystalline surface of the CD layer 106 and can pattern and/or etch the first metallization layer, as desired, to form a first group of quantum circuit elements 114 on the first surface metallization layer. The first group of quantum circuit elements 114 can comprise, for example, a qubit(s), a Josephson junction(s) of a qubit, a SQUID loop(s), a resonator(s), a capacitor(s), an inductor(s), waveguide(s), and/or microstrip lines, or portions thereof (e.g., elements of a qubit; or an element, such as a plate, of a parallel plate capacitor), and/or other quantum circuit elements or circuitry (e.g., connectors or lead lines, interconnects, electrodes, or other desired circuitry), such as more fully described herein. While one metallization layer may be deposited on this first side of the CD layer 106, as in this instance with the device 100, in some embodiments, if and as desired, the device 100 may comprise one or more additional metallization layers on this first side of the CD layer 106, such as described herein. In certain embodiments, a qubit can be a transmon qubit, although, in other embodiments, the qubit can be a different type of qubit. The qubit can comprise, for example, one or more Josephson junctions and a shunt capacitor that can be associated with the one or more Josephson junctions. In some embodiments, the qubit can be associated with a SQUID loop comprising a superconducting loop that includes one or more Josephson junctions, and can be used to desirably interact with magnetic fields. The SQUID loop can be coupled to the qubit or to a bus connecting multiple qubits, including the qubit.

In some embodiments, as part of the device 100, the device formation component can form a parallel plate capacitor (e.g., as part of quantum circuitry) that can comprise a first plate formed on the first crystalline surface of the CD layer 106 and a second plate formed on the second crystalline surface of the CD layer 106 and located to be positioned under and in proximity to the first plate, with a portion of the CD layer 106 in between the first plate and the second plate of the capacitor, wherein the first plate can be capacitively coupled to the second plate. It is to be appreciated and understood that, while some embodiments described herein can relate to devices comprising a parallel plate capacitor(s), in other embodiments, the disclosed subject matter can fabricate and utilize other types of capacitors in a device, or a desired combination of different types of capacitors.

Parallel plate capacitors, whether employed as lumped elements or in the construction of transmission lines, can follow well-defined scaling principles. If the capacitance of a structure is to be held constant as the thickness of the dielectric, d, changes, the area of the structure can change in direct proportion to d. Interaction of the electric fields of the capacitor with two-level systems, known as participation, can scale for parallel plate capacitors as the dielectric thickness, d, is varied under the constraint of constant capacitance (and energy $e^2/2C$) as follows. With regard to bulk dielectric, participation can be invariant to leading order, excluding fringing, since the capacitor area can be proportional to the dielectric thickness and $E^2$ integrated over the volume (stored energy) can be constant. With regard to the dielectric-conductor interface, participation in the thin interface region can scale as $d^{-1}$. Regarding capacitor perimeter, participation in this region can be relatively more complex due to fringing fields, however, a worse-case estimate for the scaling from conformal mapping can give scaling as $d^{-1/2}$.

The disclosed subject matter, by forming the capacitor to have the first plate formed on the first crystalline surface and the second plate formed on the second crystalline surface of the CD layer 106, where the CD layer 106 can provide a desirably thin (e.g., suitably, enhancedly, or optimally thin in thickness) crystalline layer that can be utilized as a desirably low loss tangent dielectric in the parallel plate capacitor, can enable the disclosed subject matter (e.g., device formation component) to form the parallel plate capacitors that can be desirably and significantly smaller in size than existing parallel plate capacitors formed using existing quantum circuitry fabrication techniques. The desirably low loss tangent of the crystalline layer for the parallel plate capacitor can be sufficiently low to satisfy (e.g., meet or exceed) a defined low loss tangent criterion (e.g., of defined circuit design criteria) and/or associated threshold low loss tangent value. A loss tangent of a material is based on the quality factor (Q) associated with the material (e.g., the loss tangent can be equal to 1/Q). The loss tangent and Q can be dimensionless values that have no unit of measurement. In some embodiments, the defined low loss tangent criterion can specify or indicate that a material (e.g., dielectric material) can have a sufficiently low loss tangent (e.g., for suitable use of such material in or with quantum circuits and quantum components or elements) when the loss tangent of such material is at or below $10^{-5}$. In accordance with the defined low loss tangent criterion, the disclosed subject matter can employ a defined threshold loss tangent of $10^{-5}$ where a material that has a loss tangent (e.g., loss tangent value) at or below the defined threshold loss tangent of $10^{-5}$ can have a desirably (e.g., suitably, acceptably, or optimally) low loss tangent that can indicate such material can be desirable for use in or with quantum circuits and quantum components or elements (e.g., scaled down quantum circuits, components, or elements), and where a material that has a loss tangent above the defined threshold loss tangent of $10^{-5}$ does not or may not have a sufficiently low loss tangent, which can indicate such material is not or may not be desirable for use in or with quantum circuits, components, or elements. For example, crystalline silicon (e.g., SOI) can have a desirably low loss tangent of approximately $5 \times 10^{-6}$, which can satisfy (e.g., can meet; or can be lower than) the defined threshold loss tangent, in accordance with the defined low loss tangent criterion. SOS and GOI also can have desirably low loss tangents that can satisfy the defined low loss tangent criterion. Deposited dielectrics, on the other hand, typically can be amorphous or polycrystalline and typically can have relatively higher loss tangents that are above the defined threshold loss tangent, which can make such deposited dielectrics undesirable for use in or with quantum circuits, components, or elements (e.g., scaled down quantum circuits, components, or elements).

As another example, the disclosed subject matter can fabricate or form a Josephson junction, of or associated with a qubit, where respective quantum circuit elements of the Josephson junction can be desirably formed on respective crystalline surfaces (e.g., first crystalline surface and second crystalline surface) of the CD layer 106 (e.g., a desirably thin CD layer 106). For instance, with regard to fabricating a Josephson junction (e.g., a trilayer Josephson junction, Dolan bridge Josephson junction, or other type of Josephson junction), certain quantum circuit elements (e.g., a second capacitor plate of a shunt capacitor and/or other quantum circuit elements) of the second group of quantum circuit elements 112 can be formed on the second crystalline surface of the CD layer 106, and certain other quantum circuit elements (e.g., first capacitor plate of the shunt capacitor, base electrode (BE), and/or other desired quantum circuit elements) of the first group of quantum circuit elements 114 can be formed on the first crystalline surface on the other side of the CD layer 106 from the second crystalline surface of the CD layer 106, wherein the certain quantum circuit elements of the second group 112 can be coupled (e.g., capacitively coupled or otherwise coupled) or interconnected to the certain other quantum circuit elements of the first group 114, such as more fully described herein. The CD layer 106 can provide a desirably thin crystalline dielectric layer that can be utilized as a desirably low loss tangent dielectric in quantum circuit components and elements, including with regard to Josephson junctions and parallel plate capacitors (e.g., shunt capacitors or other capacitors), and can enable the disclosed subject matter (e.g., device formation component) to form Josephson junctions, parallel plate capacitors, and other quantum circuit components or elements that can be desirably and significantly smaller in size than existing Josephson junctions, parallel plate capacitors, and other quantum circuit components or elements formed using existing quantum circuitry fabrication techniques.

Due in part to the scaling down in size of quantum circuit elements, such as described herein, the magnitude of electric fields can be relatively high and there can be an increased potential for strong interactions between circuit elements and two-level systems which can degrade the quality factor (Q) of resonators and qubits. It therefore can be desirable to identify means of mitigating this potential issue. To this end, in some embodiments, the disclosed subject matter (e.g., the device formation component) can employ a desirable exemplary process flow that can contain certain desirable features comprising, for example, the dielectric in lumped-element resonators, couplers, and qubit shunt capacitors can be processed, formed, and/or protected such that the dielectric can be untouched, or at least substantially untouched, by high energy ions; and/or the use of <111> crystalline dielectric (e.g., <111> SOI, which can be along the <111> plane of the SOI) can enable epitaxial growth of capacitor electrodes (e.g., aluminum or aluminum-based (or other desired material) capacitor electrodes), and hence, desirably high quality interfaces. In other embodiments, if and as desired, the disclosed subject matter can utilize a different type of plane of a crystalline dielectric such as, for example, <100> crystalline dielectric (e.g., <100> SOI), <110> crystalline dielectric (e.g., <110> SOI), or other desired type of plane of a crystalline dielectric in the fabrication of quantum circuit elements on the crystalline surfaces of the CD layer 106.

The disclosed subject matter can have a number of advantages over existing quantum circuitry fabrication techniques and quantum devices. For instance, the disclosed subject matter can desirably (e.g., suitably, usefully, enhancedly, and/or optimally) reduce the size of quantum circuit components and elements, can desirably increase the number and density of quantum circuit components and elements that can be fabricated and integrated on an IC chip of a quantum device (e.g., on the IC chip of the device 100), can desirably couple or interconnect quantum circuit components or elements formed on the first crystalline surface of the CD layer 106 with quantum circuit components or elements formed on the second crystalline surface of the CD layer 106, can desirably integrate quantum circuit components on the same IC chip (e.g., can integrate qubits, including shunt capacitors, SQUID loops, resonators (e.g., inductors and capacitors), other capacitors (e.g., capacitive couplers), microstrip lines, and/or other desired quantum circuit components or elements on the same IC chip) and accordingly can reduce off loading of quantum circuit components to other IC chips. In addition to the coherence-related and other features of the disclosed subject matter, the disclosed subject matter can provide for the desirable (e.g., suitable, useful, enhanced, and/or optimal) integration of multiple wiring levels on the same substrate (e.g., handle wafer) as that upon which the qubits reside.

In some embodiments, the qubit(s), comprising a Josephson junction(s) and shunt capacitor(s), capacitor(s), inductor(s), microstrip signal lines, and/or other circuitry (e.g., SQUID loops, interconnects, connector or lead lines, electrodes, capacitive couplers, or other desired quantum circuitry) can be formed or integrated on a single die (e.g., a single IC chip).

Figure 2:
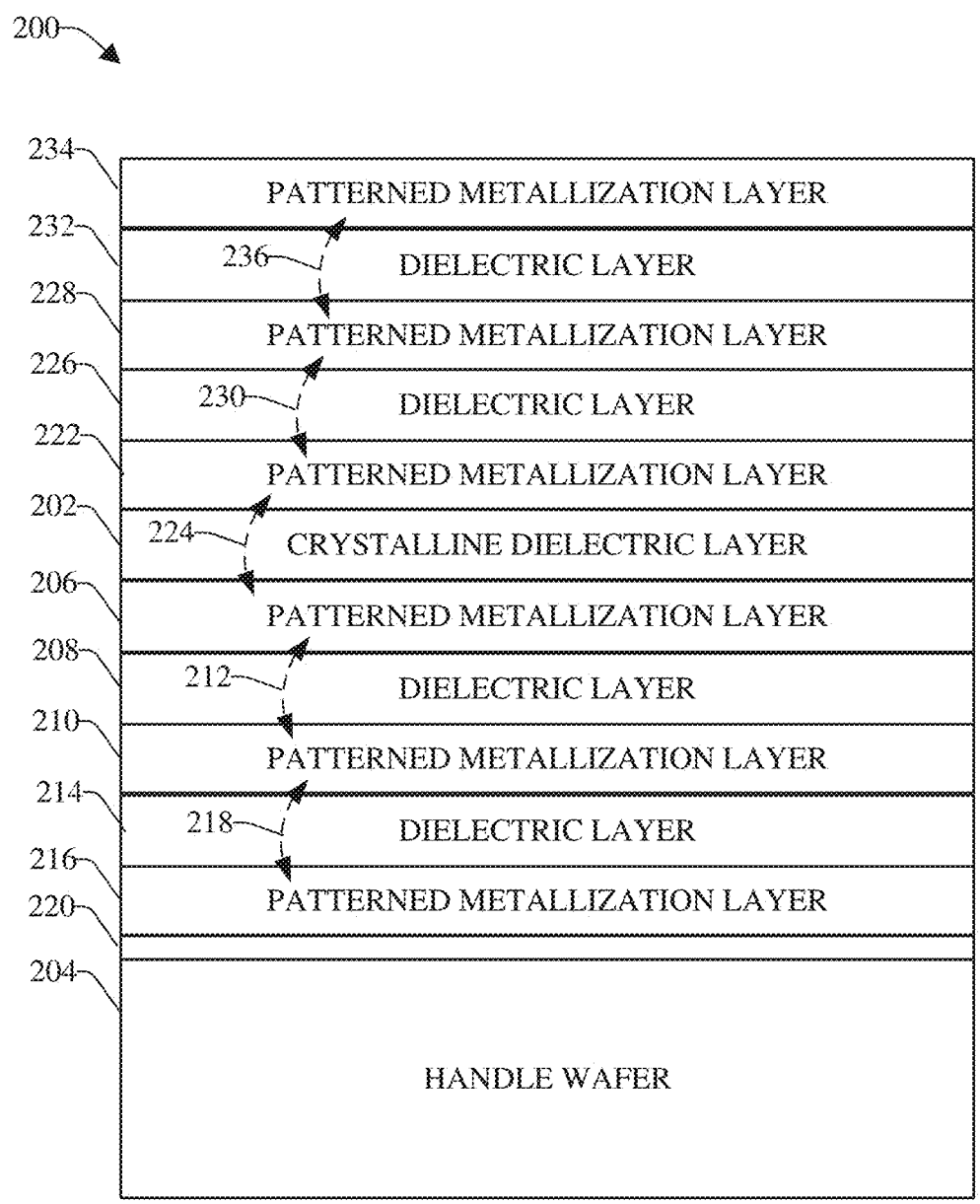
FIG. 2 depicts a block diagram of an example, non-limiting device comprising multiple patterned metallization layers formed on respective sides of a crystalline dielectric layer, and comprising respective groups of quantum circuit elements formed on respective crystalline surfaces of the crystalline dielectric layer and/or other dielectric surfaces, in accordance with various aspects and embodiments of the disclosed subject matter.

Referring to FIG. 2, FIG. 2 depicts a block diagram of an example, non-limiting device 200 (e.g., quantum device, qubit device, or multi-qubit device) comprising multiple patterned metallization layers formed on respective sides of a CD layer, and comprising respective groups of quantum circuit elements formed on respective crystalline surfaces of the CD layer and/or other dielectric surfaces, in accordance with various aspects and embodiments of the disclosed subject matter.

The device 200 can comprise a CD layer 202. In some embodiments, a desired number of vias can be formed in the CD layer 202, such as described herein. Initially, the chip stack of the device 200 can be inverted from how it is depicted in FIG. 2, and can comprise a substrate associated with a BOX layer that can be associated with the CD layer 202, where the substrate can be at the bottom of the chip stack, such as more fully described herein. During the disclosed quantum circuitry fabrication process, at the desired (e.g., appropriate or suitable) time, a handle wafer 204 can be associated with the opposite end (e.g., top end) of the chip stack, the chip stack can be turned over to place the handle wafer 204 at the bottom of the chip stack and the substrate at the top of the chip stack, and the substrate and BOX layer can be removed, such as described herein.

The device formation component (not shown in FIG. 2; and as described herein) can deposit a metallization layer onto the second crystalline surface of the CD layer 202, and can pattern and/or etch the metallization layer to form a patterned metallization layer 206 that can comprise quantum circuit elements (e.g., a second group of quantum circuit elements). In some embodiments, to facilitate forming additional conductive (e.g., superconductive) layers, and quantum circuit components or elements formed therefrom, on this second side of the CD layer 202, the device formation component can apply (e.g., deposit) or associate a dielectric layer 208 to or with the top surface of the patterned metallization layer 206. If and as desired to facilitate forming desired quantum circuitry, the device formation component can form a desired number of vias in the dielectric layer 208 to facilitate creating interconnects that can span to each side of the dielectric layer 208 and respective quantum circuit elements formed on respective sides of the dielectric layer 208. The device formation component can deposit another metallization layer on the surface of the dielectric layer 208, and can pattern and/or etch this metallization layer to form a patterned metallization layer 210 that can comprise desired quantum circuit elements. If and as desired to facilitate forming desired quantum circuitry, as indicated by reference numeral 212, certain quantum circuit elements of the patterned metallization layer 206 can be coupled (e.g., capacitively coupled or otherwise coupled) or connected (e.g., via interconnects formed using the vias formed in the dielectric layer 208) to certain other quantum circuit elements of the patterned metallization layer 210.

In certain embodiments, if and as desired to facilitate forming desired quantum circuitry, the device formation component can apply or associate another dielectric layer 214 to or with the top surface (e.g., the then exposed surface) of the patterned metallization layer 210. If and as desired to facilitate forming desired quantum circuitry, the device formation component can form a desired number of vias in the dielectric layer 214 to facilitate creating interconnects that can span to each side of the dielectric layer 214 and respective quantum circuit elements formed on respective sides of the dielectric layer 214. The device formation component can deposit another metallization layer on the surface of the dielectric layer 214, and can pattern and/or etch this metallization layer to form a patterned metallization layer 216 that can comprise desired quantum circuit elements. If and as desired to facilitate forming desired quantum circuitry, as indicated by reference numeral 218, certain quantum circuit elements of the patterned metallization layer 210 can be coupled (e.g., capacitively coupled or otherwise coupled) or connected (e.g., via interconnects formed using the vias formed in the dielectric layer 214) to certain other quantum circuit elements of the patterned metallization layer 216.

At this point (unless there are additional metallization layers to add on this side of the CD layer 202), the device formation component can apply (e.g., deposit) a seal layer 220 to the patterned metallization layer 216, and can bond the handle wafer 204 to the seal layer 220, such as described herein. At this point of the disclosed quantum circuitry fabrication process, the device formation component, another component or device, or a user can turn over the chip stack to place the handle wafer 204 at the bottom of the chip stack and the substrate at the top of the chip stack, and the substrate and BOX layer can be removed (e.g., grinded, etched, or polished away), such as described herein.

The device formation component can deposit a metallization layer onto the first crystalline surface of the CD layer 202, and can pattern and/or etch the metallization layer to form a patterned metallization layer 222 that can comprise quantum circuit elements (e.g., a first group of quantum circuit elements). If and as desired to facilitate forming desired quantum circuitry, as indicated by reference numeral 224, certain quantum circuit elements of the patterned metallization layer 222 formed on the first crystalline surface of the CD layer 202 can be coupled (e.g., capacitively coupled or otherwise coupled) or connected (e.g., via interconnects formed using the vias formed in the CD layer 202) to certain other quantum circuit elements of the patterned metallization layer 206 formed on the second crystalline surface of the CD layer 202, such as described herein.

In some embodiments, to facilitate forming additional conductive (e.g., superconductive) layers, and quantum circuit components or elements formed therefrom, on this first side of the CD layer 202, the device formation component can apply (e.g., deposit) or associate a dielectric layer 226 to or with the top surface of the patterned metallization layer 222. If and as desired to facilitate forming desired quantum circuitry, the device formation component can form a desired number of vias in the dielectric layer 226 to facilitate creating interconnects that can span to each side of the dielectric layer 226 and respective quantum circuit elements formed on respective sides of the dielectric layer 226. The device formation component can deposit another metallization layer on the surface of the dielectric layer 226, and can pattern and/or etch this metallization layer to form a patterned metallization layer 228 that can comprise desired quantum circuit elements. If and as desired to facilitate forming desired quantum circuitry, as indicated by reference numeral 230, certain quantum circuit elements of the patterned metallization layer 222 can be coupled (e.g., capacitively coupled or otherwise coupled) or connected (e.g., via interconnects formed in the vias formed in the dielectric layer 226) to certain other quantum circuit elements of the patterned metallization layer 228.

In certain embodiments, if and as desired to facilitate forming desired quantum circuitry, the device formation component can apply or associate another dielectric layer 232 to or with the top surface of the patterned metallization layer 228. If and as desired to facilitate forming desired quantum circuitry, the device formation component can form a desired number of vias in the dielectric layer 232 to facilitate creating interconnects that can span to each side of the dielectric layer 232 and respective quantum circuit elements formed on respective sides of the dielectric layer 232. The device formation component can deposit another metallization layer on the surface of the dielectric layer 232, and can pattern and/or etch this metallization layer to form a patterned metallization layer 234 that can comprise desired quantum circuit elements. If and as desired to facilitate forming desired quantum circuitry, as indicated by reference numeral 236, certain quantum circuit elements of the patterned metallization layer 228 can be coupled (e.g., capacitively coupled or otherwise coupled) or connected (e.g., via interconnects formed using the vias formed in the dielectric layer 232) to certain other quantum circuit elements of the patterned metallization layer 234.

It is to be appreciated and understood that, while the disclosed subject matter describes the device 200 as having three conductive layers (and two associated dielectric layers) on each side of the CD layer 202, in other embodiments, the disclosed subject matter can employ less than three conductive layers or more than three conductive layers on each side of the CD layer 202 and/or can employ different numbers of conductive layers (e.g., patterned metallization layers comprising superconducting material) for each side of the CD layer 202 depending in part on the desired design for the quantum circuit for the device, in accordance with defined circuit design criteria.

Figure 3:
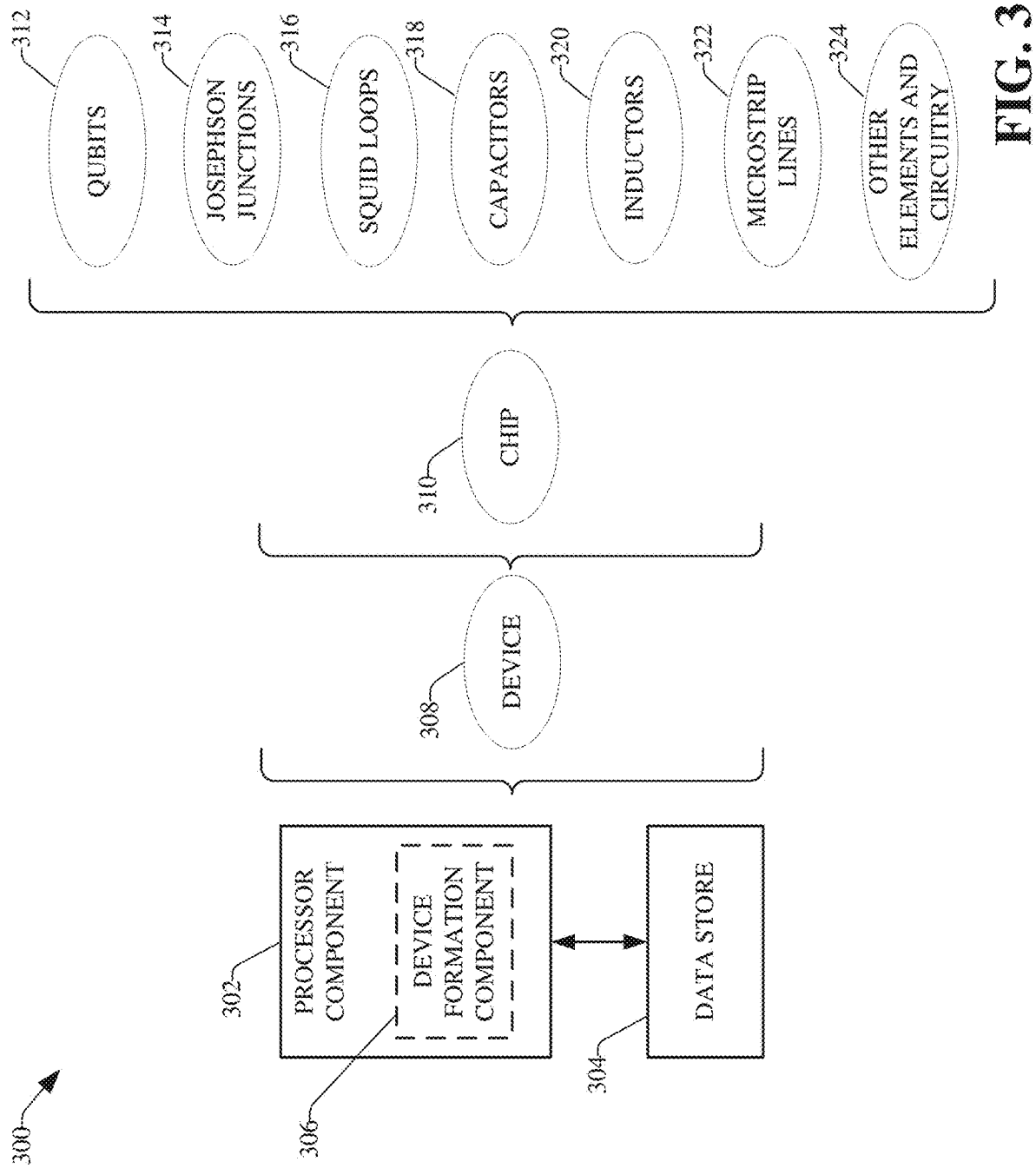
FIG. 3 depicts a block diagram of an example, non-limiting system that can be utilized to create, form, or design a device comprising qubits and associated quantum components, elements, and circuitry, in accordance with various aspects and embodiments of the disclosed subject matter.
Figure 4:
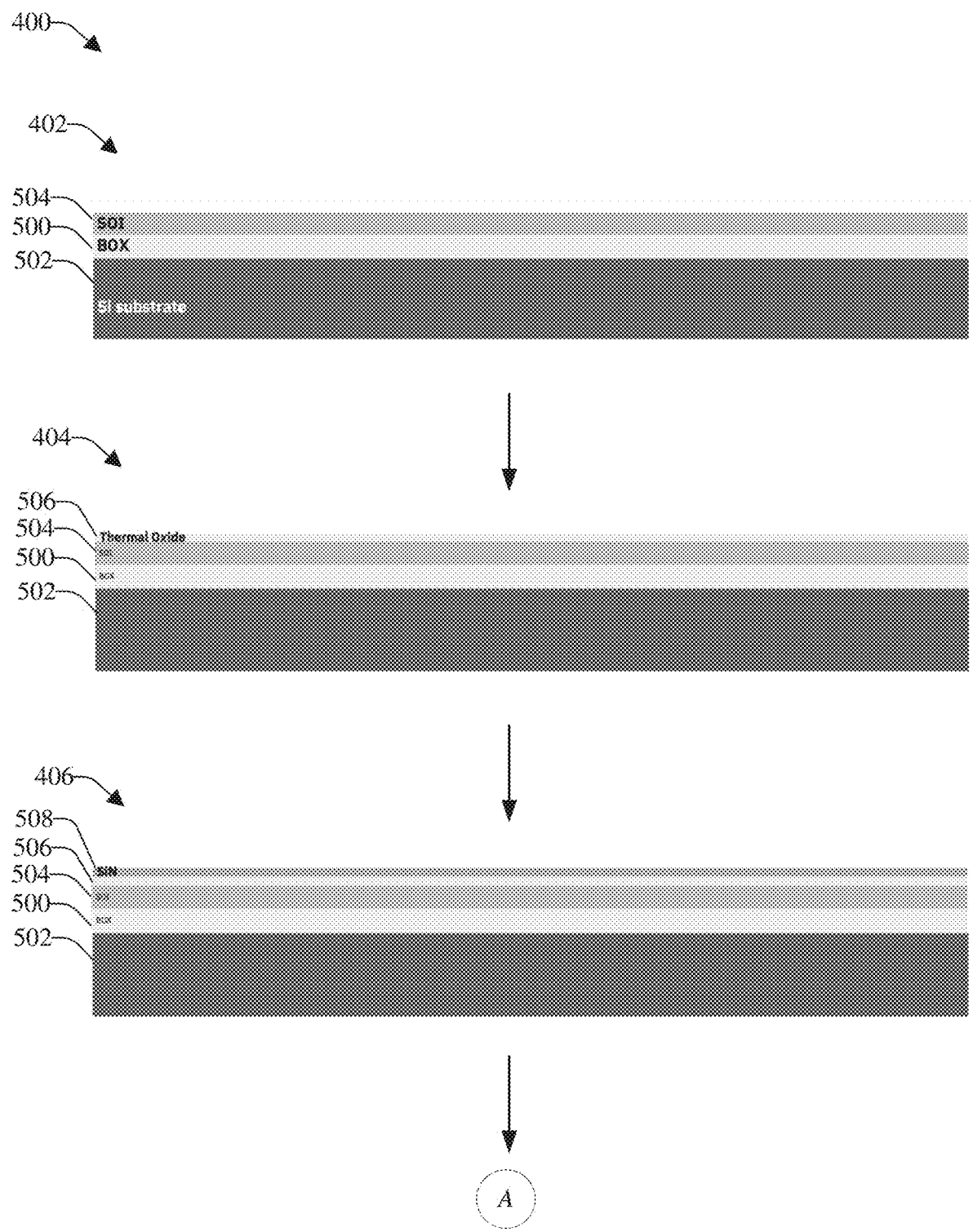
FIGS. 4-10 illustrate diagrams of an example quantum circuitry fabrication process that can be utilized to create, form, fabricate, or design quantum circuitry, comprising quantum circuit elements, on crystalline surfaces on each side of a silicon-on-insulator (SOI) layer, in accordance with various aspects and embodiments of the disclosed subject matter.

FIG. 3 depicts a block diagram of an example system 300 that can be utilized to create, form, or design a device comprising qubits and associated quantum components, elements, and circuitry, in accordance with various aspects and embodiments of the disclosed subject matter. The system 300 can comprise a processor component 302 and a data store 304. In accordance with various embodiments, the processor component can comprise or be associated with (e.g., communicatively connected to) a device formation component 306 that can be utilized to create, form, or design various components of or associated with a qubit device 308, including qubits and associated quantum components, elements, and circuitry, such as more fully described herein. For instance, the device formation component 306 can be utilized to create, form, or design the various components of a device 308 that can be formed or situated on a chip 310 (e.g., a quantum computer or qubit device IC chip), or more than one chip, if desired. The various components can comprise, for example, qubits 312, Josephson junctions 314 (e.g., trilayer Josephson junctions, Dolan bridge Josephson junctions, or other type of Josephson junction), SQUID loops 316, capacitors 318, inductors 320, microstrip lines 322, and/or other associated elements and circuitry 324.

As part of and to facilitate creating, forming, or designing the various components of or associated with a device 308, the device formation component 306 can form or process substrates and handle wafers. Also, as part of and to facilitate creating, forming, or designing the various components and/or circuitry of or associated with the device 308, the device formation component 306 also can form, deposit, remove (e.g., selectively remove or etch), pattern, or process materials, including silicon or silicon-based materials, metallization layers (e.g., superconducting materials, such as aluminum, aluminum-based superconducting materials, niobium, niobium-based superconducting materials, or other desired superconducting material), crystalline dielectric materials (e.g., SOI, SOS, GOI, or other suitable type of crystalline dielectric material), or other materials of the device 308. For example, the device formation component 306 can employ and/or can control various processes, including fabrication processes, microfabrication processes, nanofabrication processes, material deposition processes (e.g., a low pressure chemical vapor deposition (LPCVD) process), masking or photoresist processes, photolithography processes, chemical etching processes (e.g., reactive-ion etching (RIE) process, a potassium hydroxide (KOH) etching process, isotropic etching process, wet etching process, and/or buffered etching process), other etching or removal processes, epitaxial processes, patterning processes, planarization processes (e.g., chemical-mechanical planarization or polishing (CMP) process), component formation processes, and/or other desired processes to desirably form, deposit, remove (e.g., selectively remove or etch), pattern, or process materials to facilitate creating or forming the respective components or circuitry of the device 308.

The processor component 302 can work in conjunction with the other components (e.g., the data store 304, the device formation component 306, or another component) to facilitate performing the various functions of the system 300. The processor component 302 can employ one or more processors, microprocessors, or controllers that can process data, such as information relating to designing, fabricating, or forming quantum computers, qubits, Josephson junctions, SQUID loops, coplanar waveguides, inductors, capacitors, electrodes, and/or other components or devices, information relating to material deposition processes, material patterning processes, and material removal processes, and information relating to circuit design criteria, circuit design algorithms, traffic flows, policies, protocols, interfaces, tools, and/or other information, to facilitate operation of the system 300, as more fully disclosed herein, and control data flow between the system 300 and other components (e.g., computer components, computer, laptop computer, other computing or communication device, or network device) associated with (e.g., connected to) the system 300.

The data store 304 can store data structures (e.g., user data, metadata), code structure(s) (e.g., modules, objects, hashes, classes, procedures) or instructions, information relating to designing, fabricating, or forming quantum computers, qubits, Josephson junctions, SQUID loops, coplanar waveguides, inductors, capacitors, electrodes, and/or other components or devices, information relating to material deposition processes, material patterning processes, and material removal processes, and information relating to circuit design criteria, circuit design algorithms, traffic flows, policies, protocols, interfaces, tools, and/or other information, to facilitate controlling operations associated with the system 300. In an aspect, the processor component 302 can be functionally coupled (e.g., through a memory bus) to the data store 304 in order to store and retrieve information desired to operate and/or confer functionality, at least in part, to the data store 304, the device formation component 306, or other component, and/or substantially any other operational aspects of the system 300.

It should be appreciated that the data store 304 described herein can comprise volatile memory and/or nonvolatile memory. By way of example and not limitation, nonvolatile memory can include read only memory (ROM), programmable ROM (PROM), electrically programmable ROM (EPROM), electrically erasable ROM (EEPROM), nonvolatile quantum memory, or flash memory. Volatile memory can include random access memory (RAM) or volatile quantum memory, which can act as external cache memory. By way of example and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the disclosed aspects are intended to comprise, without being limited to, these and other suitable types of memory.

Referring to FIGS. 4-10 (along with FIG. 3), FIGS. 4-10 illustrate diagrams of an example quantum circuitry fabrication process 400 that can be utilized to create, form, fabricate, or design quantum circuitry, comprising quantum circuit elements, on crystalline surfaces on each side of an SOI layer, in accordance with various aspects and embodiments of the disclosed subject matter. The device formation component 306 can perform the quantum circuitry fabrication process 400 to create, form, fabricate, or design the quantum circuitry, comprising quantum circuit elements, on crystalline surfaces on each side of the SOI layer (e.g., on crystalline surfaces on each side of the crystalline silicon material that makes up the SOI layer). It is to be appreciated and understood that, while, in these embodiments, this quantum circuitry fabrication process 400 describes using SOI, in other embodiments, the disclosed subject matter can utilize a desired crystalline dielectric material, such as SOI, SOS, GOI, or other desired (e.g., suitable or acceptable) crystalline dielectric material.

As indicated at reference numeral 402 of the quantum circuitry fabrication process 400, the device formation component 306 can form or bond an oxide layer as a buried oxide (BOX) layer 500 material in or on a substrate 502 (e.g., silicon or silicon-based substrate), and form or bond an SOI layer 504 on the BOX layer 500. The substrate 502 can have desired dimensions corresponding to the size of the chip package (e.g., substrate can have length and width that each can be sized on the order of millimeters or tens of millimeters, and a thickness that can be on the order of millimeters), such as described herein. In some embodiments, the BOX layer 500 can be silicon dioxide ($SiO_2$) or other desired silicon-based material that can have desired dimensions (e.g., length and width can correspond to the length and width of the chip (e.g., the substrate of the chip) and the thickness can range from 25 nm to 150 nm). The SOI layer 504 can have desired dimensions that can correspond, at least in part, to the dimensions of the substrate 502 and the BOX layer 500. In accordance with various embodiments, the thickness (e.g., height) of the SOI layer 504 can range from 100 nm to 100 μm (or another desired thickness).

As indicated at reference numeral 404 of the quantum circuitry fabrication process 400, the device formation component 306 can form, add, or deposit a thermal oxidation layer 506 on top of the SOI layer 504. The thermal oxidation layer 506 can have desired dimensions that can correspond, at least in part, to the dimensions of the substrate 502 and the BOX layer 500. Qubits typically can be sensitive to contamination that may occur during fabrication of the device. The thermal oxidation of the thermal oxidation layer 506 can be compatible with SOI (e.g., compatible with silicon of the SOI) and can be employed to protect the SOI to aid in preventing the SOI layer 504 from incurring defects during fabrication of the device. The thermal oxidation layer 506 can be utilized to be subject to some of the processing of the device, instead of the SOI layer 504 being subject to such processing and potentially incurring defects as a result of such processing.

Figure 5:
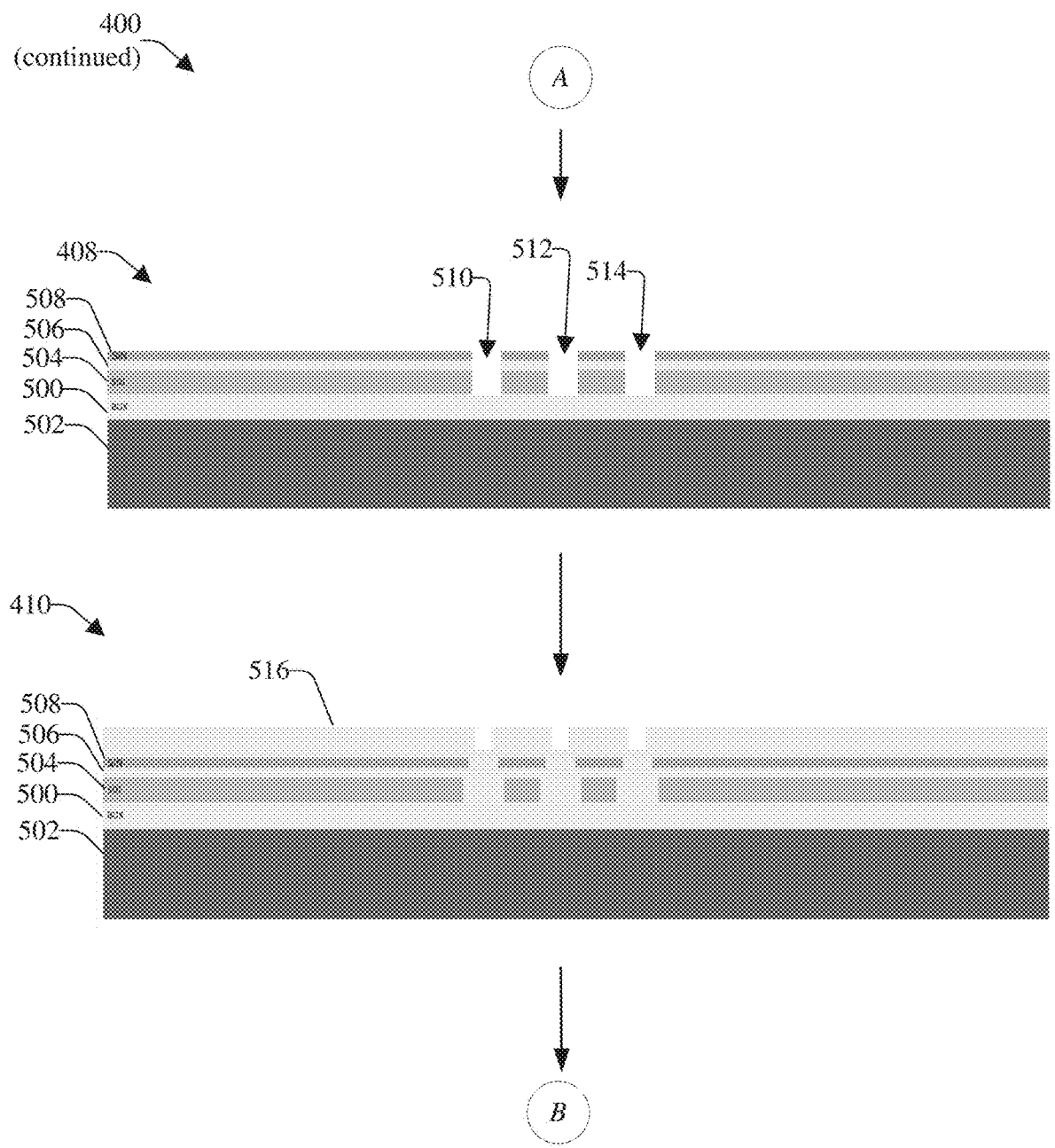

In some embodiments, the device formation component 306 can form or deposit a silicon nitride (SiN) layer 508 on the thermal oxidation layer 506 using a desired material deposition process, as indicated at reference numeral 406 of the quantum circuitry fabrication process 400. The SiN layer 508 can be employed to facilitate forming a desired mask that can protect the surface of the SOI layer 504. For instance, the SiN layer 508 can act as a CMP stop layer and/or can protect the surface of the SOI from undesired oxidation during subsequent oxidation processes that can be performed on the device, such as described herein. In certain embodiments, if and as desired, another type of material (e.g., another silicon-based material) can be formed or deposited on the thermal oxidation layer 506, instead of SiN. In accordance with various embodiments, the thermal oxidation of the SOI can be approximately 100 nm in thickness, or can be greater than or less than 100 nm in thickness. At this point, the quantum circuitry fabrication process 400 can proceed to reference point A, wherein the quantum circuitry fabrication process 400 can continue from reference point A to reference numeral 408 of the quantum circuitry fabrication process 400, as shown in FIG. 5.

As indicated at reference numeral 408 of the quantum circuitry fabrication process 400, the device formation component 306 can etch a desired number of vias, such as vias 510, 512, and 514, in SiN layer 508, thermal oxidation layer 506, and the SOI layer 504 down to and stopping at the BOX layer 500. In some embodiments, the device formation component 306 can employ a RIE process to etch the vias, although, in other embodiments, another desired etching process can be utilized to etch the vias. Etching the vias (e.g., 510, 512, and 514) can enable access of both sides of the SOI layer 504 electrically. The device formation component 306 can mask or pattern the desired formation of vias and/or other quantum circuit elements on the SiN layer 508. The vias (e.g., 510, 512, and 514) can be used, for example, to establish desired paths for interconnects (e.g., conductive interconnects) that can connect quantum circuit elements on this side (e.g., current top side, as depicted) of the SOI layer 504 of the device to other quantum circuit elements on the other side (e.g., opposite side) of the SOI layer 504 of the device, such as described herein.

Figure 6:
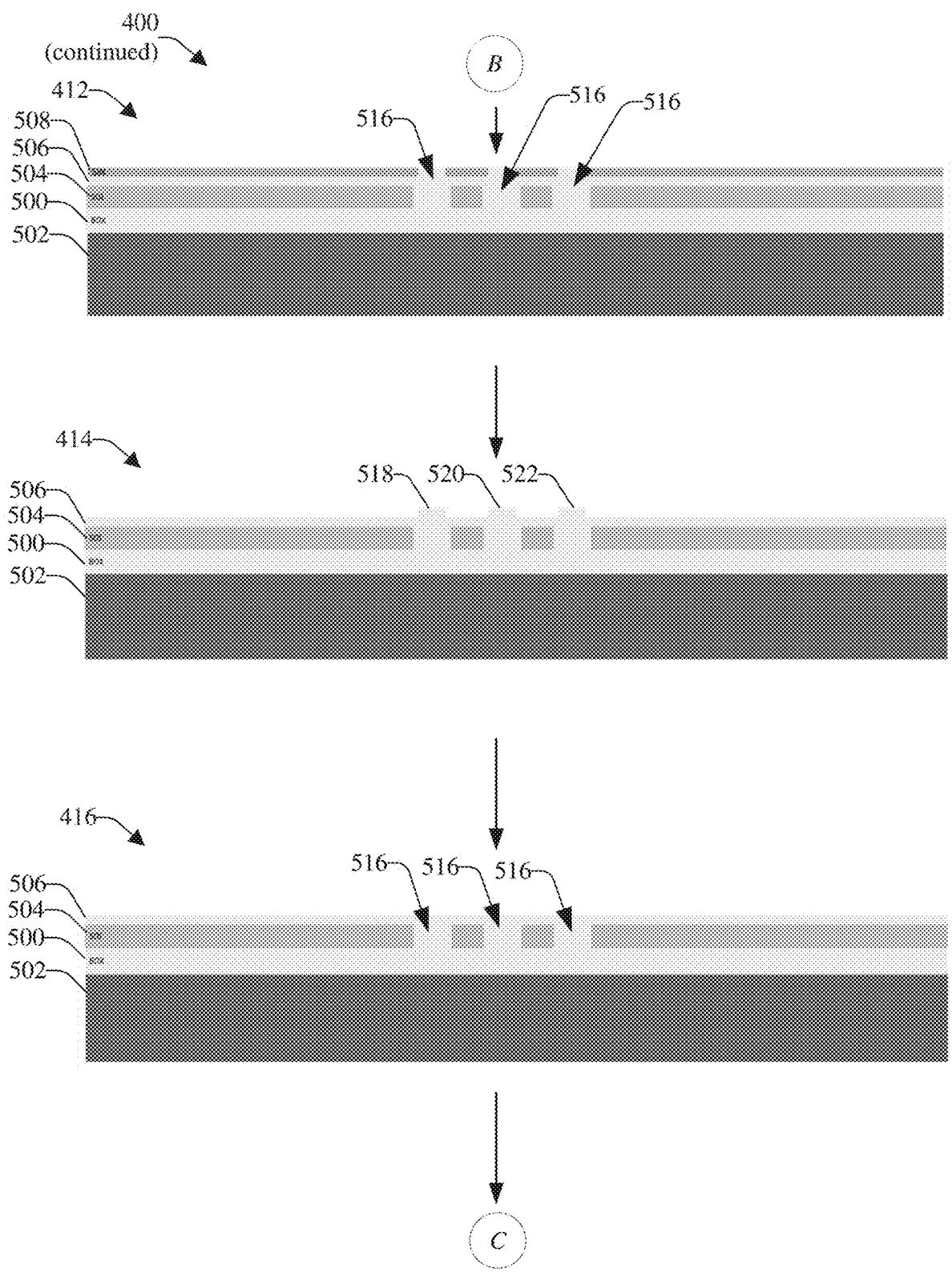

As indicated at reference numeral 410 of the quantum circuitry fabrication process 400, the device formation component 306 can apply or deposit a desired oxide material 516, such as high density plasma (HDP) oxide, HDP chemical vapor deposition (HDPCVD) oxide, or other desired higher quality oxide, to fill the gaps (e.g., gap regions), such as the vias (e.g., 510, 512, and 514), and/or on top of the SiN layer 508. Such oxide material can have a desired thickness, which can correspond to or be based on the size of the device and/or gaps that are being filled. During subsequent processing, the oxide material can be removed by the device formation component 306 to form desired holes (e.g., vias) that metallization material can go through to form desired interconnects between quantum circuit elements on this side of the SOI layer 504 of the device to other quantum circuit elements that can be formed on the other side of the SOI layer 504 of the device, such as described herein. At this point, the quantum circuitry fabrication process 400 can proceed to reference point B, wherein the quantum circuitry fabrication process 400 can continue from reference point B to reference numeral 412 of the quantum circuitry fabrication process 400, as shown in FIG. 6.

As indicated at reference numeral 412 of the quantum circuitry fabrication process 400, the device formation component 306 can perform a desired polishing process (e.g., CMP process) to polish or remove undesired material, such as a desired portion of the oxide material on the top surface of the chip stack of the device down to the top surface of the SiN layer 508 to facilitate obtaining or achieving a desired planar starting surface for formation of quantum circuit elements on the SOI surface of the device, such as described herein. For instance, the device formation component 306, performing the desired polishing process (e.g., CMP process), can polish (e.g., polish away) or remove oxidation material (e.g., a desired portion of oxidation material from the application of the oxidation material to fill the gaps and/or other oxidation material) on the top of the chip stack. As disclosed, the SiN layer 508 can provide a desirable polishing stop layer (e.g., CMP stop layer) during polishing of the surfaces of the chip stack of the device to facilitate stopping, blocking, or preventing polishing or removal of the surface(s) (e.g., top surface or other surface) of the SOI layer 504 during this polishing process.

As indicated at reference numeral 414 of the quantum circuitry fabrication process 400, the device formation component 306 can apply a desired SiN removal process to remove the SiN layer 508 from the chip stack. In some embodiments, the device formation component 306 can utilize phosphoric acid (e.g., a suitably hot phosphoric acid) to remove the SiN layer 508 down to the thermal oxidation layer 506, where other oxidation material (e.g., 516) also can remain after removal of the SiN layer 508. Oxidation material portions 518, 520, and 522, which were in gaps in the SiN layer 508 and on the same level of the chip stack that the SiN layer 508 was in the chip stack, can remain after removal of the SiN layer 508.

Figure 7:
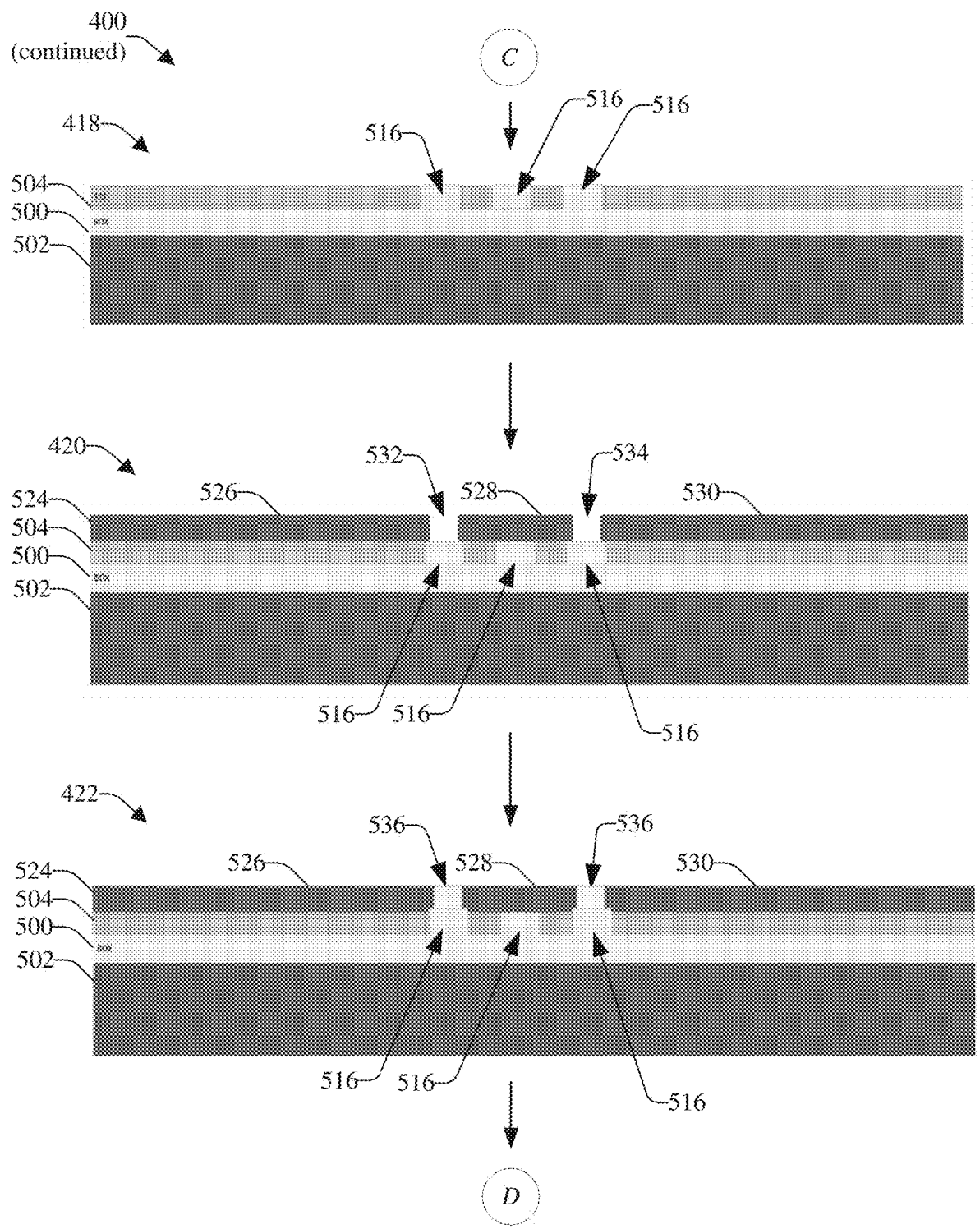

As indicated at reference numeral 416 of the quantum circuitry fabrication process 400, the device formation component 306 can perform a desired touch polish on the top surface (e.g., a portion of the oxidation material) of the chip stack to remove, for example, certain oxidation material, such as oxidation material portions 518, 520, and 522 of raised oxidation material, that remained after removal of the SiN layer 508. The touch polish can produce a desired planar surface layer of oxidation material. At this point, the quantum circuitry fabrication process 400 can proceed to reference point C, wherein the quantum circuitry fabrication process 400 can continue from reference point C to reference numeral 418 of the quantum circuitry fabrication process 400, as shown in FIG. 7.

As indicated at reference numeral 418 of the quantum circuitry fabrication process 400, the device formation component 306 can perform a desired material removal process to remove the surface layer portion of the oxidation material (e.g., thermal oxide material and other oxide material) to preclean and expose a surface on one side of the SOI layer. The desired material removal process can be, for example, an etching process, such as a wet etch process, using hydrofluoric (HF) acid and/or a buffered etching material that can be non-damaging to the surface of the SOI layer 504 and can expose or reveal the surface of the SOI layer 504, which can be in a desirable (e.g., suitable, pristine, non-damaged or at least substantially non-damaged, or optimal) condition as a result of the protective processes that were performed by the device formation component 306 earlier in the quantum circuitry fabrication process 400. The surface of the SOI layer 504 can be in a desirable condition for deposition of a metallization layer (e.g., layer of superconducting material) on the surface of the SOI layer 504, as described herein.

As indicated at reference numeral 420 of the quantum circuitry fabrication process 400, the device formation component 306 can deposit a metallization layer 524 (M0 metal layer) on the exposed surface of the SOI layer 504 using a desired metal deposition process (e.g., an LPCVD process) and can pattern (e.g., etch and pattern) the metallization layer 524 to form desired quantum circuit elements and associated quantum circuitry with the metal. The metallization layer 524 can have desired dimensions (e.g., length and width can correspond to the length and width of the substrate 502, and the thickness can be in a range on the order of tens of nanometers). In some embodiments, as part of the patterning process, the device formation component 306 can employ a desired etching process, such as RIE, to desirably and selectively etch away certain portions of the metallization layer 524 and leave desired portions (e.g., portions 526, 528, and 530) of the metallization layer 524 remaining on the surface of the SOI layer 504 to facilitate fabricating, forming, creating, or shaping the desired quantum circuit elements and associated quantum circuitry on the surface of the SOI layer 504. As part of the patterning of the metallization layer 524, gaps (e.g., etched regions), such as gaps 532 and 534, can be formed in between respective portions (e.g., portions 526, 528, and 530) of the remaining metallization layer 524.

It is to be appreciated and understood that, while this example chip stack of this example device is depicting one metallization layer 524 (M0 metal layer) on this side of the SOI layer 504, if and as desired, one or more additional metallization layers can be added (e.g., deposited) and/or stacked on this side of the SOI layer 504 to form a desired multi-level metallization structure (e.g., multi-level wiring structure) on that side of the SOI layer 504. For example, the device formation component 306 can deposit a dielectric layer on top of the M0 metal layer, deposit another metallization layer on top of the dielectric layer, and/or deposit a second dielectric layer on top of the second metallization layer and deposit yet another metallization layer on top of the second dielectric layer, and so on, such as described herein.

In some embodiments, the metallization layer(s) 524, as patterned and/or etched, on this side of the SOI layer 504 can be utilized for forming or to facilitate forming interconnects (e.g., superconductive interconnects (e.g., using the vias formed in the SOI layer 504)) between quantum circuit components or elements (e.g., qubits, capacitors, or other components or elements) that can be formed on the other side of the SOI layer 504 and quantum circuit components or elements formed on this side of the SOI layer 504 and/or other desired circuitry, such as described herein. In certain embodiments, in addition or alternatively, the group of quantum circuit elements formed on this side of the SOI layer 504 can comprise a qubit(s), a Josephson junction(s) of a qubit, a SQUID loop(s), a capacitor(s), an inductor(s), a resonator(s), and/or microstrip lines, and/or connectors or lead lines, or portions thereof (e.g., elements of a qubit; or an element, such as a plate, of a capacitor).

Figure 8:
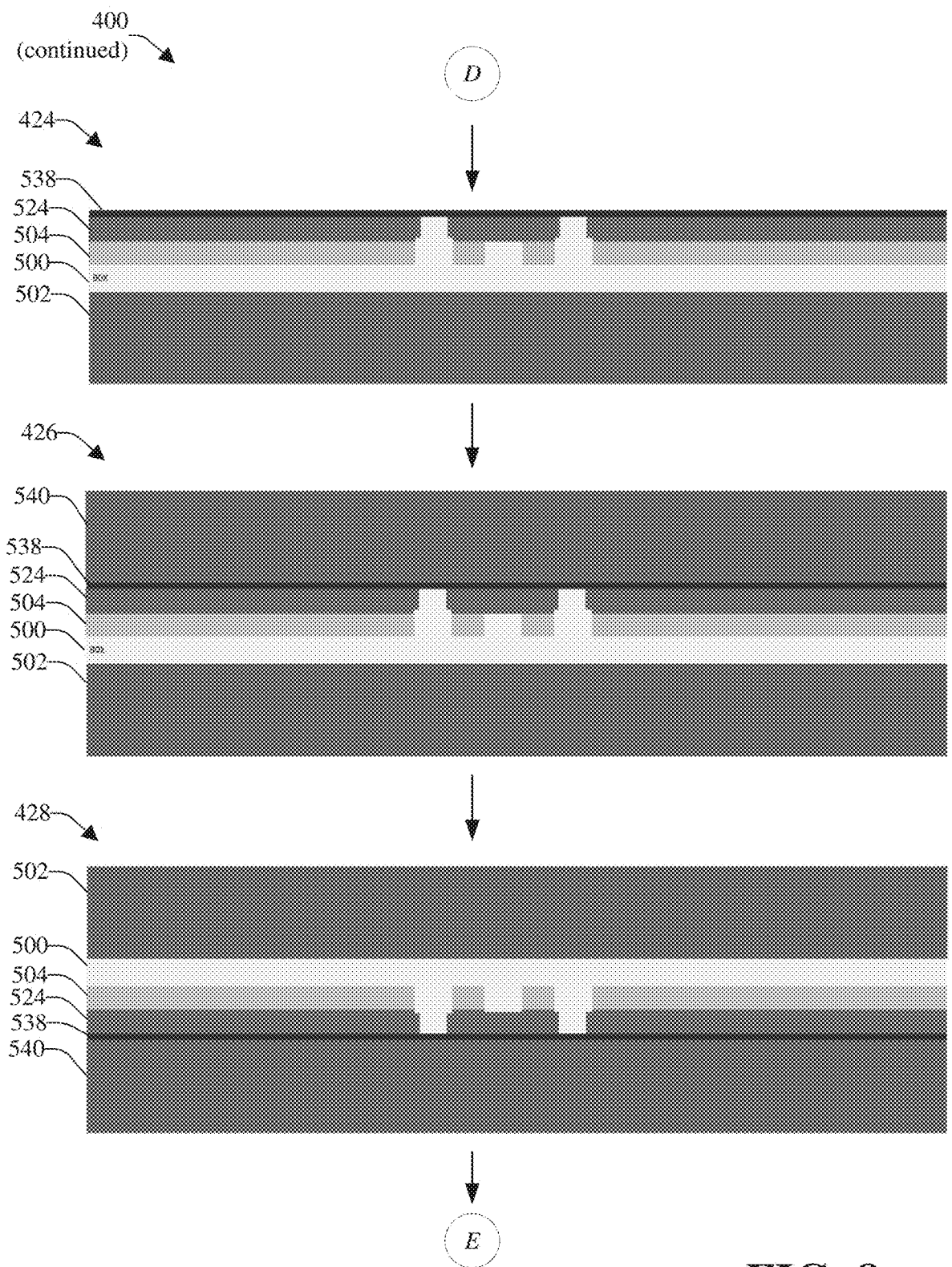

As indicated at reference numeral 422 of the quantum circuitry fabrication process 400, the device formation component 306 can deposit a desired oxide material 536 (e.g., $SiO_2$) into the gaps (e.g., gaps 532 and 534) to fill the gaps such that the top end of the oxide material 536 can be even or substantially even with the top (e.g., currently exposed) surface of the metallization layer 524. In some embodiments, the device formation component 306 also can perform a polishing or planarization process to polish or planarize the oxide material 536. At this point, the quantum circuitry fabrication process 400 can proceed to reference point D, wherein the quantum circuitry fabrication process 400 can continue from reference point D to reference numeral 424 of the quantum circuitry fabrication process 400, as shown in FIG. 8.

In some embodiments, after the depositing and patterning of the desired number of metallization layers on this side of the SOI layer 504 and the associated depositing and polishing of oxide material in the gaps, as indicated at reference numeral 424 of the quantum circuitry fabrication process 400, the device formation component 306 can deposit a seal layer 538 on top of the portions (e.g., portions 526, 528, and 530) of the remaining metallization layer 524 (or on top of the highest metallization layer in the stack if there is more than one metallization layer on this side of the SOI layer 504) and the oxide material 536 in the gaps (e.g., gaps 532 and 534). In some embodiments, the seal layer 538 can be an HF-resistant seal layer, and can comprise a desired material, such as, for example, SiN or α-Si. The seal layer 538 can have desired dimensions (e.g., length and width can correspond to the length and width of the substrate 502, and the thickness can be in a range on the order of tens of nanometers), with the height (e.g., thickness) of the seal layer 538 typically being less than the height of the metallization layer 524. The seal layer 538 can protect the materials (e.g., remaining portions of the metallization layer 524, surface of the SOI layer 504, and other material) from the HF that can be used on the chip stack of the device later in the quantum circuitry fabrication process 400, as described herein.

In other embodiments, the disclosed subject matter can omit, bypass, or not deposit such a seal layer on the portions of the remaining metallization layer 524 (or on top of the highest metallization layer in the chip stack if there is more than one metallization layer on this side of the SOI layer 504) and the oxide material 536 in the gaps (e.g., gaps 532 and 534). Instead, the device formation component 306 can bond the handle wafer 540 to the remaining (e.g., patterned) metallization layer 524 via a desired bond, such as, for example, a metal-metal bond or oxide-oxide bond. For instance, the device formation component 306 can place or apply a piece of metal or piece of patterned metal on or to the handle wafer 540 and form a metal-metal bond with the patterned metallization layer 524 to bond the handle wafer 540 to the patterned metallization layer 524 and associated chip stack. If a patterned piece of metal is used, the patterned piece of metal can be patterned to have a pattern that can correspond to the pattern of the patterned metallization layer 524. If an oxide-oxide bond is employed, the device formation component 306 can place or apply a layer of oxide to the handle wafer 540 and can form an oxide-oxide bond between the layer associated with the oxide on the handle wafer and the layer of oxide associated with the remaining metallization layer 524.

As indicated at reference numeral 426 of the quantum circuitry fabrication process 400, the device formation component 306 can bond a handle wafer 540 to the top or exposed surface of the seal layer 538 using a desired bonding process and/or bonding material. In accordance with various embodiments, the device formation component 306 can utilize an adhesive bonding (e.g., employing a desired adhesive material), a metal-metal bond, or an oxide-oxide bond. The handle wafer 540 can be formed of a desired material (e.g., silicon or silicon-based material, or other desired dielectric material). The handle wafer 540 can have desired dimensions (e.g., length and width can correspond to the length and width of the substrate 502, and the thickness can be in a range on the order of tens of nanometers), with the thickness of the handle wafer 540 typically being significantly larger than the thickness of the metallization layer 524 or SOI layer 504.

Figure 9:
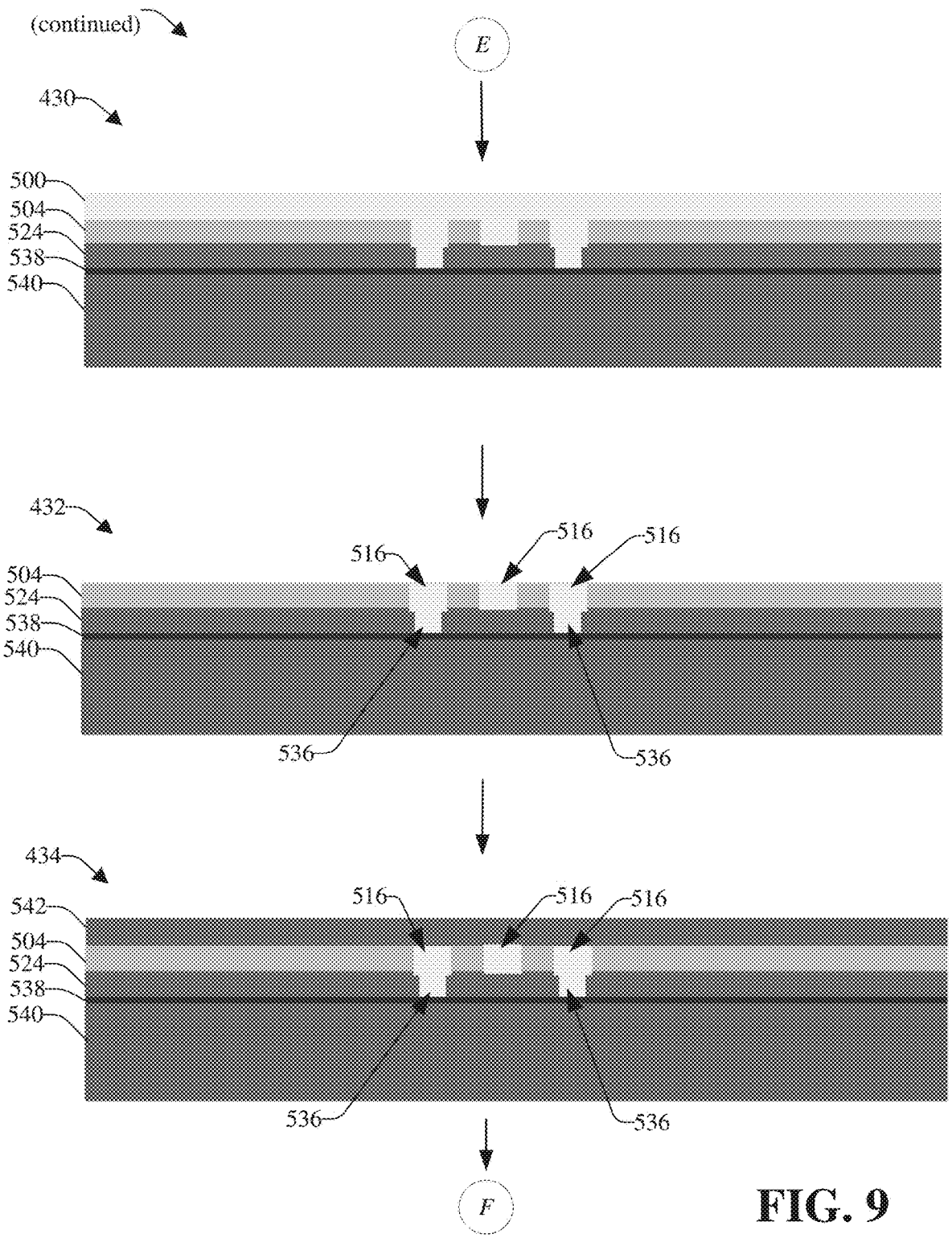

As indicated at reference numeral 428 of the quantum circuitry fabrication process 400, the chip stack can be turned over (e.g., flipped over) to place the substrate 502 at the top of the chip stack and the handle wafer 540. The chip stack can be turned over to facilitate processing the other side of the SOI layer 504 and fabricating quantum circuit components or elements on the other surface of the SOI layer 504, such as described herein. At this point, the quantum circuitry fabrication process 400 can proceed to reference point E, wherein the quantum circuitry fabrication process 400 can continue from reference point E to reference numeral 430 of the quantum circuitry fabrication process 400, as shown in FIG. 9.

As indicated at reference numeral 430 of the quantum circuitry fabrication process 400, the device formation component 306 can remove the substrate 502, using a desired material removal process, to expose the BOX layer 500 underneath the substrate 502. For instance, the device formation component 306 can grind, polish, and/or etch away the substrate 502 to expose the surface of the BOX layer 500.

As indicated at reference numeral 432 of the quantum circuitry fabrication process 400, the device formation component 306 can remove and/or polish (e.g., polish to remove) substantially all of the BOX layer 500, stopping such removal and/or polishing just above the surface of the SOI layer 504, and can preclean the surface, by performing an HF preclean process, to expose the surface on the SOI layer 504. As disclosed, the HF precleaning process can be non-damaging to the surface of the SOI layer 504 and can expose or reveal the surface of the SOI layer 504, which can be in a desirable (e.g., suitable, pristine, non-damaged or at least substantially non-damaged, or optimal) condition as a result of the protective processes that were performed by the device formation component 306 during the removal of the BOX layer 500 as well as the other protective processes that were performed during the quantum circuitry fabrication process 400. This other surface of the SOI layer 504 (just like the surface on the other side of the SOI layer 504 was) can be in a desirable condition for deposition of a metallization layer (e.g., layer of superconducting material) on the surface of the SOI layer 504, such as described herein.

Figure 10:
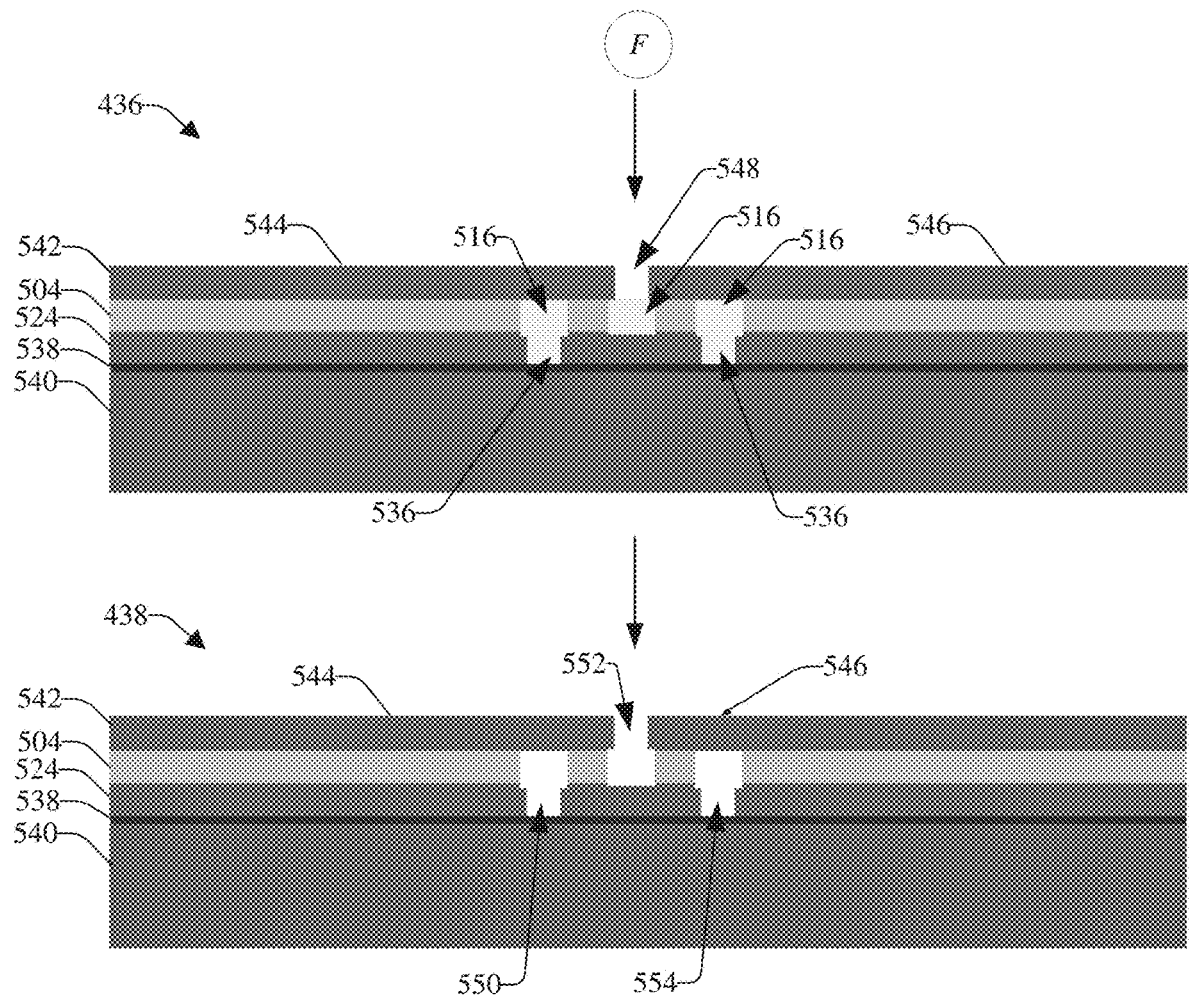

As indicated at reference numeral 434 of the quantum circuitry fabrication process 400, the device formation component 306 can deposit a metallization layer(s) 542 (M1 metal layer and/or other metal layers, such as an M2 metal layer) onto the surface of the SOI layer 504. In accordance with various embodiments, the depositing of the metallization layer(s) 542 can be a capacitor or resonator level for a Dolan bridge build for a qubit or part of a trilayer for a trilayer build (e.g., trilayer Josephson junction build) of a qubit or part of another type of build for a qubit and associated Josephson junction(s), such as more fully described herein. The metallization layer(s) 542 can have desired dimensions (e.g., length and width can correspond to the length and width of the handle wafer 540, and the thickness can be in a range on the order of tens of nanometers). At this point, the quantum circuitry fabrication process 400 can proceed to reference point F, wherein the quantum circuitry fabrication process 400 can continue from reference point F to reference numeral 436 of the quantum circuitry fabrication process 400, as shown in FIG. 10.

As indicated at reference numeral 436 of the quantum circuitry fabrication process 400, the device formation component 306 can pattern (e.g., etch and pattern) the metallization layer(s) 542 to form desired quantum circuit elements and associated quantum circuitry with the metal. In some embodiments, as part of the patterning process, the device formation component 306 can employ a desired etching process, such as RIE, to desirably and selectively etch away certain portions of the metallization layer(s) 542 and leave desired portions (e.g., portions 544 and 546) of the metallization layer(s) 542 remaining on the surface of the SOI layer 504 to facilitate fabricating, forming, creating, or shaping the desired quantum circuit elements and associated quantum circuitry on the surface of the SOI layer 504, such as more fully described herein. As part of the patterning of the metallization layer(s) 542, gaps (e.g., etched regions), such as gap 548, can be formed in between respective portions (e.g., portions 544 and 546) of the remaining metallization layer(s) 542. In some embodiments, the desired quantum circuit elements and associated quantum circuitry can comprise, for example, a qubit(s), a Josephson junction(s) of a qubit, a SQUID loop(s), a capacitor(s), an inductor(s), a resonator(s), and/or microstrip lines, or portions thereof (e.g., elements of a qubit; or an element, such as a plate, of a capacitor), and/or other circuitry (e.g., connectors or lead lines, interconnects, electrodes, or other desired circuitry).

In some embodiments, a shadow mask Josephson junction can be employed, and, in the case of a shadow mask Josephson junction, the device formation component 306 can suspend the Josephson junction if it is deposited on oxide or can fabricate the Josephson junction on etched SOT. In certain embodiments, a trilayer Josephson junction can be formed, and, in the case of a trilayer Josephson junction, the device formation component 306 can first pattern the counter electrode (CE), as more fully described herein, and the device formation component 306 can complete the formation of the quantum circuit for the trilayer Josephson junction with an oxide fill, CMP, and deposition and patterning of an M2 metal layer (e.g., to form an air bridge) to form the trilayer Josephson junction and associated components and circuitry.

As indicated at reference numeral 438 of the quantum circuitry fabrication process 400, the device formation component 306 remove or etch the remaining oxide material 516 and 536 (e.g., SiO$_2$ material) to form desirable open regions (e.g., open regions 550, 552, and 554) in the SOI layer 504 and the metallization layers 524 and 542 on the respective surfaces of the respective sides of the SOI layer 504, and, if the device is employing a trilayer Josephson junction, forming the air bridge on the M2 metal layer. In accordance with various embodiments, the device formation component 306 can utilize anhydrous vapor HF or fluorinated plasma as etchants, or utilize another type(s) of etchant that has appropriate isotropy and selectivity properties, to etch away the oxide material 516 and 536 to form the desired open regions (e.g., open regions 550, 552, and 554). In some embodiments, with regard to the trilayer Josephson junction (if employed), the device formation component 306 can form the bridge by isotropic etch from open areas on either side of the patterned metal.

It is to be appreciated and understood that, while the quantum circuitry fabrication process 400 is described herein with regard to using SOI, in some embodiments, if SOS (or other desired and desirable (e.g., suitable or acceptable) crystalline dielectric material) is utilized, the disclosed subject matter (e.g., device formation component 306) can modify the quantum circuitry fabrication process 400 and associated disclosed techniques to account for the use of SOS (or other desired crystalline dielectric material), instead of SOI. For instance, instead of a BOX layer in the initial chip stack, the initial chip stack can comprise the substrate, the SOS layer (e.g., the sapphire material) on top of the substrate, and a silicon layer on top of the SOS layer. The device formation component 306 can selectively etch the silicon layer and the SOS layer to form a desired number of gaps the silicon layer and the SOS layer (e.g., where the gaps in the SOS layer can be vias) that can enable access of both sides of the SOS layer electrically, and fill (e.g., using oxide material) the gaps and polish, similar to as described herein. The device formation component 306 can continue to perform the modified quantum circuitry fabrication process in a relatively similar form as the quantum circuitry fabrication process 400, including exposing a crystalline surface of the SOS layer (e.g., the crystalline sapphire material), in part, by removing (e.g., etching away) the silicon layer, depositing a metallization layer (M0 metal layer) on the exposed surface of the SOS layer (and/or one or more additional metallization layers), and patterning the metallization layer (M0 metal layer) to form or facilitate forming interconnects (e.g., using the vias formed in the SOS layer) between quantum circuit components or elements and/or form or facilitate forming other quantum circuit components or elements, such as described herein. The device formation component 306 can bond the handle wafer to the patterned metallization layer or a seal layer (if a seal layer is applied to the patterned metallization layer) using a desired bond, can turn over the chip stack, and can remove the substrate to expose the other crystalline surface on the other side of the SOS layer. The device formation component 306 can deposit another metallization layer (M1 metal layer) on this other crystalline surface of the SOS layer (and/or deposit an M2 metal layer and/or one or more additional metallization layers, if and as desired), and can pattern the metallization layer (M1 metal layer) to form or facilitate forming desired quantum circuit components or elements, where desired quantum circuit components or elements formed on the M1 metal layer can be coupled with or interconnected to (e.g., using superconductive interconnects formed in the vias) quantum circuit components or elements formed on the M0 metal layer, such as described herein.

Figure 11:
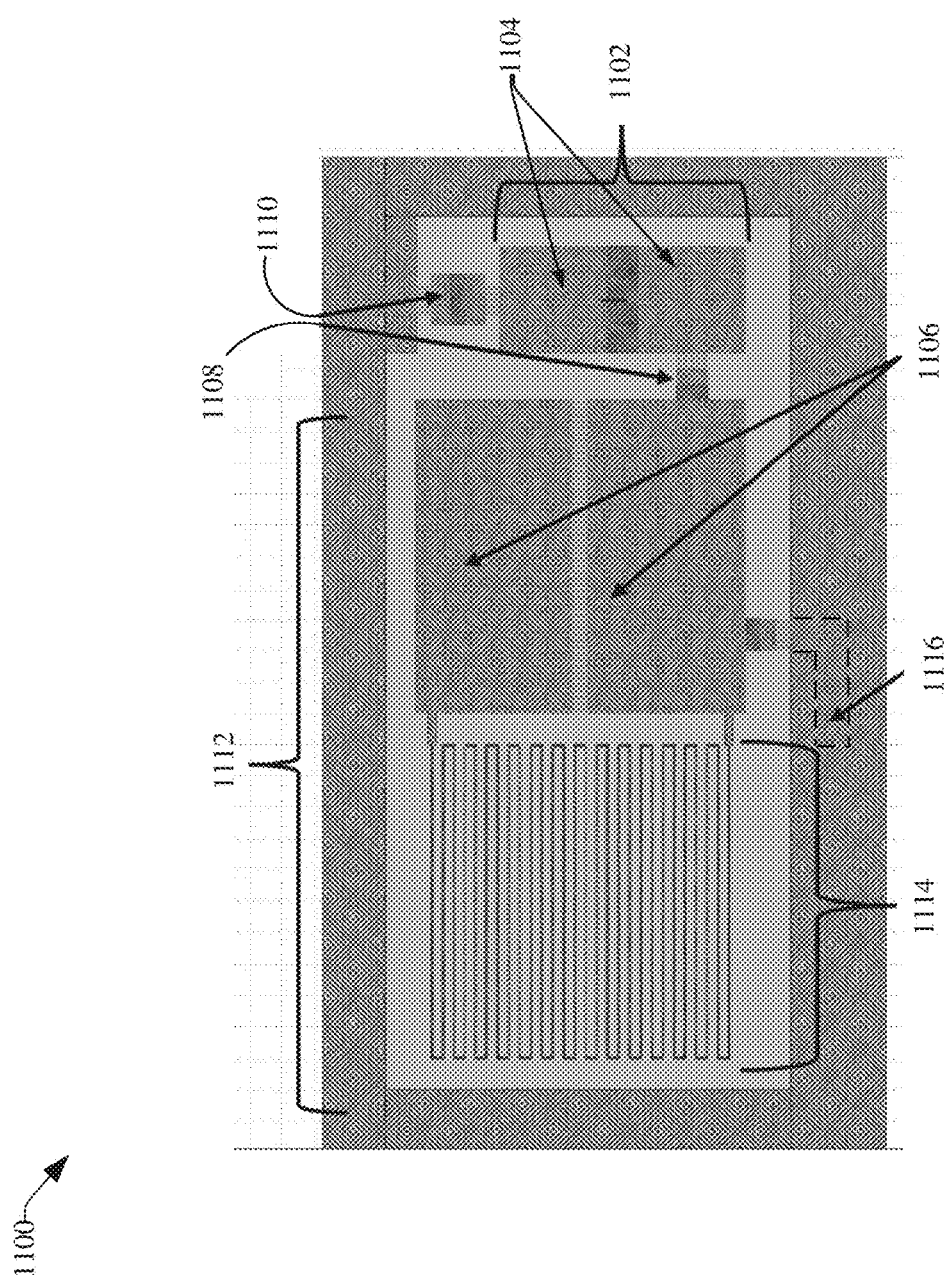
FIG. 11 depicts a diagram of an example, non-limiting device that can be formed using the example quantum circuitry fabrication process where the device can comprise quantum circuitry, comprising quantum circuit elements, formed on crystalline surfaces on each side of an SOI layer, in accordance with various aspects and embodiments of the disclosed subject matter.

Turning to FIG. 11, FIG. 11 depicts a diagram of an example, non-limiting device 1100 (e.g., quantum device, qubit device, or multi-qubit device) that can be formed using the quantum circuitry fabrication process 400 where the device 1100 can comprise quantum circuitry, comprising quantum circuit elements, formed on crystalline surfaces on each side of an SOI layer, in accordance with various aspects and embodiments of the disclosed subject matter. The device 1100 can comprise various desired quantum circuit components and elements, such as a qubit, resonator, microstrip lines (e.g., microstrip signal lines), and bus couplers, such as described herein. In some embodiments, the perimeter of the quantum circuit of the device 1100 can be 316 µm by 316 µm, although, in other embodiments, the length and/or width of the quantum circuit of the device 1100 each can be greater than or less than 316 µm. The quantum circuitry of the device 1100 can comprise an SOI capacitor dielectric that can be desirably thin, such as, for example, 1 µm, such as described herein. In other embodiments, the SOI capacitor dielectric can be greater than or less than 1 µm in thickness. In certain embodiments, wire bonds or bump bonds can connect to either the M0 metal layer (e.g., M0 metal layer 524) or the M1 metal layer/BE layer (e.g., M1 metal layer 542), such as described herein. If and as desired, in accordance with (e.g., and when specified by) the defined circuit design criteria, the disclosed subject matter (e.g., employing the device formation component 306) can form superconducting metal vias through the SOI layer, which can provide desirable additional quantum circuit compactness (e.g., can provide increased quantum circuit density) and/or desirable quantum circuit design flexibility.

For instance, the device 1100 can comprise a qubit 1102 that can comprise a parallel plate shunt capacitor 1104. In some embodiments, the shunt capacitance of the parallel plate shunt capacitor 1104 can be 60 fF, although, in other embodiments, parallel plate shunt capacitors with shunt capacitances greater than or less than 60 fF can be used. The qubit 1102 also can comprise a Josephson junction associated with the parallel plate shunt capacitor 1104, such as described herein. The qubit 1102 can be coupled to a parallel plate capacitor 1106 via a parallel plate capacitive coupler component 1108. The device 1100 also can comprise one or more other parallel plate capacitive coupler components, such as parallel plate capacitive coupler component 1110, that can be utilized to couple the qubit 1102 to other quantum circuit components or elements (e.g., another qubit, other quantum circuitry, or an interface (e.g., an input interface or an output interface)) formed on the same IC chip or a different IC chip. In some embodiments, the parallel plate capacitive coupler components can have a capacitance of 5 fF, although, in other embodiments, parallel plate capacitive coupler components with capacitances greater than or less than 5 fF can be used.

The device 1100 also can comprise a resonator 1112 that can comprise the parallel plate capacitor 1106 and an inductor 1114 that can be associated with (e.g., connected to) the parallel plate capacitor 1106. In accordance with various embodiments, the resonator 1112 can be a discrete element inductor or other desired type of inductor, and/or the inductor 1114 can be a bare inductor or other desired type of inductor. In some embodiments, the device 1100 further can comprise microstrip lines, such as microstrip lines 1116, that can be associated with the parallel plate capacitor 1106 (or other components of the device 1100) to facilitate connecting the parallel plate capacitor 1106 (or other components of the device 1100) to other quantum circuit components or elements formed on the same IC chip or a different IC chip.

Figure 12:
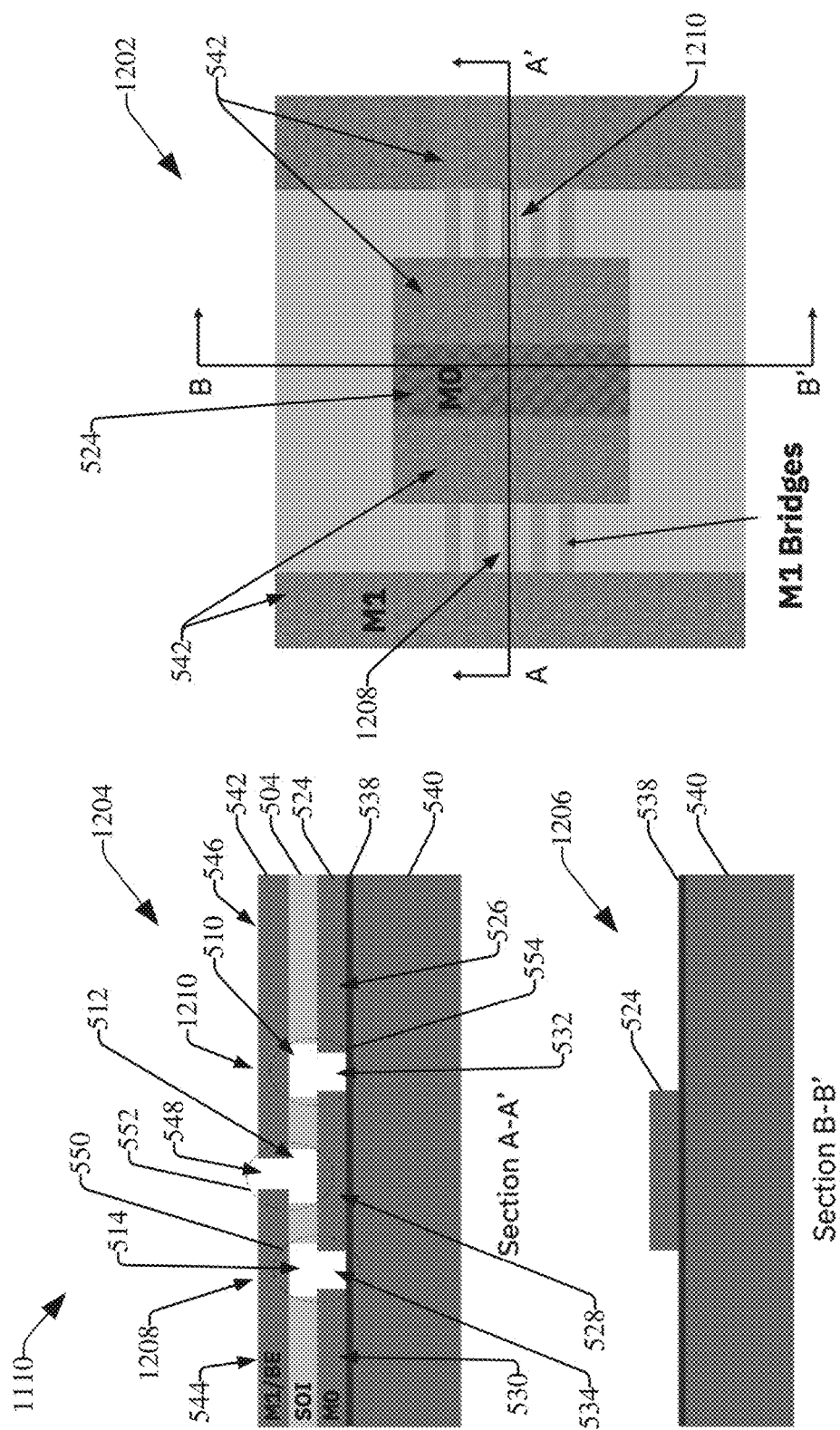
FIG. 12 illustrates diagrams of a top view and side cross-sectional views of an example, non-limiting parallel plate capacitive coupler component of the device, in accordance with various aspects and embodiments of the disclosed subject matter.

Referring to FIG. 12, FIG. 12 illustrates diagrams of a top view and side cross-sectional views of an example, non-limiting parallel plate capacitive coupler component 1110 of the device 1100, in accordance with various aspects and embodiments of the disclosed subject matter. The diagrams can comprise a top view 1202, a first side cross-sectional view 1204 (A-A'), and a second side cross-sectional view 1206 (B-B') of the parallel plate capacitive coupler component 1110. In the top view 1202, of the parallel plate capacitive coupler component 1110, the M1 metal layer 542 (also referred to here as the M1/BE metal layer) and a portion of the M0 metal layer 524 can be observed. The M0 metal layer 524 can essentially have a moat around it, as a portion of the metallization layer at the M0 level that surrounds the M0 metal layer 524 was removed by the device formation component 306 during patterning of the metallization layer at the M0 level, such as described herein. In the top view 1202, a portion of the M0 metal layer 524 can be obscured by the M1 metal layer 542. As can be observed in the top view 1202, the parallel plate capacitive coupler component 1110 can comprise a desired number of bridge components, such as bridge component 1208 and bridge component 1210, on the M1 metal layer 542 on each side of parallel plate capacitive coupler component 1110 to facilitate coupling one side of the parallel plate capacitive coupler component 1110 to the other side of the parallel plate capacitive coupler component 1110 as well as coupling a quantum circuit component or element associated with one side of the parallel plate capacitive coupler component 1110 to another quantum circuit component or element associated with the other side of the parallel plate capacitive coupler component 1110.

As depicted in the first side cross-sectional view 1204 (A-A'), the seal layer 538 can be bonded to the handle wafer 540, such as described herein. The M0 metal layer 524 can be associated with the seal layer 538. The M0 metal layer 524 can be formed on, and patterned on, the second crystalline surface of the SOI layer 504, where gaps (e.g., gaps 532 and 534)) can be formed between portions (e.g., portions 526, 528, and 530) of the M0 metal layer 524, such as described herein. The M1 metal layer 542 can be formed on, and patterned on, the first crystalline surface of the SOI layer 504, where a gap (e.g., gap 548) can be formed between portions (e.g., portions 544 and 546) of the M1 metal layer 542, such as described herein. Vias (e.g., vias 510, 512, and 514) can be formed in the SOI layer 504, such as described herein. The respective vias and gaps can form desired open regions (e.g., open regions 550, 552, and 554) in the SOI layer 504 and the metallization layers 524 and 542, such as described herein. As also is depicted in the first side cross-sectional view 1204 (A-A'), the bridge components 1208 and 1210 can span across the open regions 550 and 554.

As depicted in the second side cross-sectional view 1206 (B-B') of the parallel plate capacitive coupler component 1110, the portion 528 of the M0 metal layer 524 can be associated with the seal layer 538, which can be bonded to the handle wafer 540. Based on the structuring of the parallel plate capacitive coupler component 1110, there can be a desired coupling (e.g., capacitive coupling) between the portion 544 of the M1 metal layer 542 and the portion 530 of the M0 metal layer 524, a desired coupling between the portion 544 of the M1 metal layer 542 and the portion 528 of the M0 metal layer 524, a desired coupling between the portion 546 of the M1 metal layer 542 and the portion 528 of the M0 metal layer 524, and a desired coupling between the portion 546 of the M1 metal layer 542 and the portion 526 of M0 metal layer 524.

Figure 13:
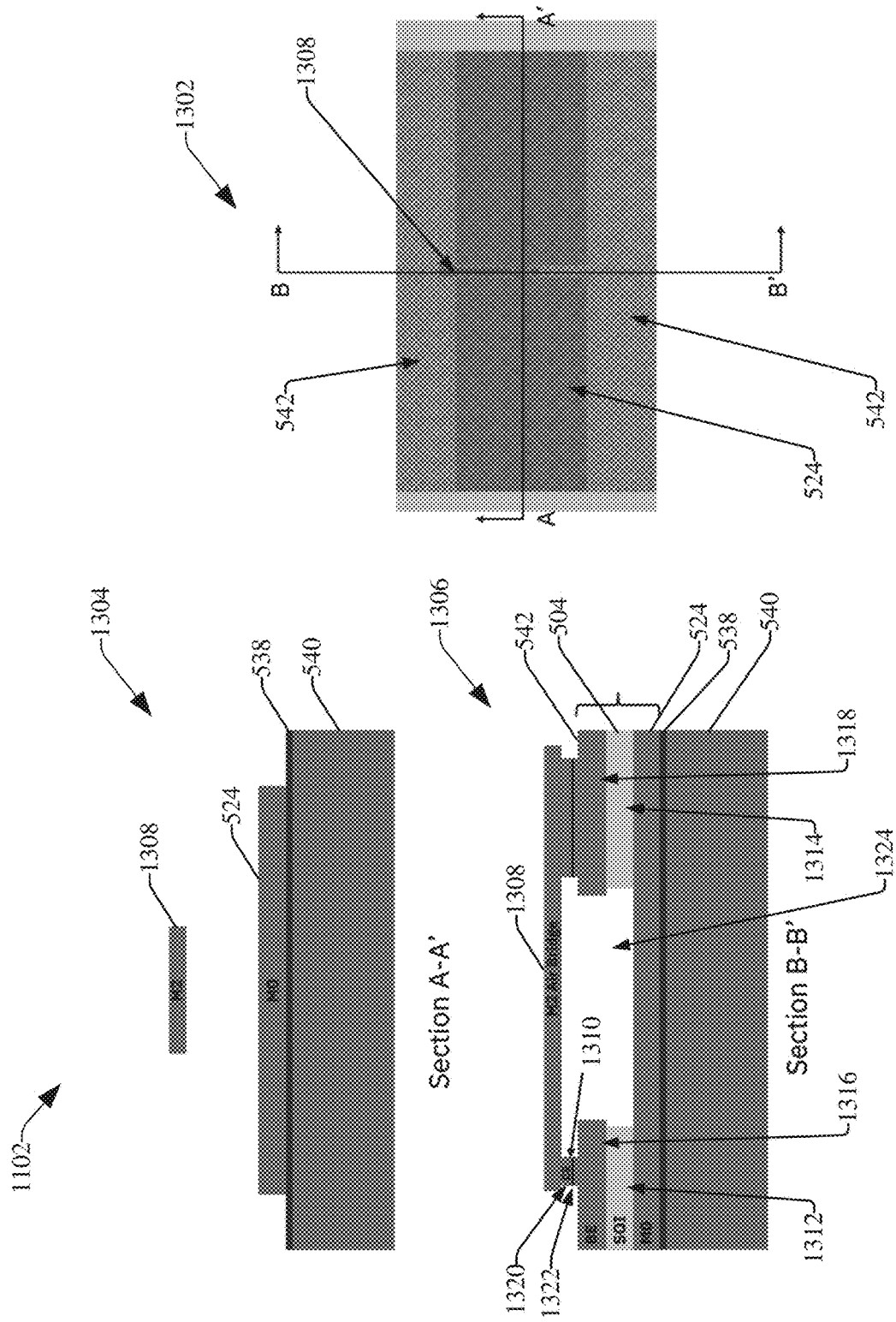
FIG. 13 depicts diagrams of a top view and side cross-sectional views of an example, non-limiting qubit of the device, in accordance with various aspects and embodiments of the disclosed subject matter.

Referring to FIG. 13, FIG. 13 depicts diagrams of a top view and side cross-sectional views of an example, non-limiting qubit 1102 of the device 1100, in accordance with various aspects and embodiments of the disclosed subject matter. The diagrams can comprise a top view 1302, a first side cross-sectional view 1304 (A-A'), and a second side cross-sectional view 1306 (B-B') of the qubit 1102. In the top view 1302, of the qubit 1102, a portion of the M1 metal layer 542 (also referred to here as the M1/BE metal layer), a portion of the M0 metal layer 524, and a portion of an M2 metal layer 1308 can be observed. In some embodiments, the qubit 1102 can comprise a trilayer Josephson junction 1310 (as depicted). In other embodiments, a Dolan bridge Josephson junction or other type of Josephson junction can be formed and utilized.

As depicted in the second side cross-sectional view 1306 (B-B') of the qubit 1102, the seal layer 538 can be bonded to the handle wafer 540, such as described herein. The M0 metal layer 530 can be associated with the seal layer 538 (e.g., the seal layer 538 was applied to or deposited on the M0 metal layer 524, such as described herein). The M0 metal layer 524 can be formed and/or patterned on respective SOI layer portions 1312 and 1314 on the second crystalline surface of the SOI layer 504. With regard to the M1 metal layer 542, there can be respective portions 1316 and 1318 of the M1 metal layer 542 formed and/or patterned on the respective SOI layer portions 1312 and 1314 on the first crystalline surface of the SOI layer 504. As can be observed, part of each of the portions 1316 and 1318 of the M1 metal layer 542 can overhang beyond the respective SOI layer portions 1312 and 1314. A second layer of the trilayer build can be the CE layer 1320 where the CE can be formed, such as described herein. The device formation component 306 can form a tunnel barrier 1322 for the Josephson junction 1310. In some embodiments, the device formation component 306 can apply a desired superconducting material on the M1 metal layer 542 or as part of the M1 metal layer 542 to build up that portion of the M1 metal layer 542, can oxidize that portion of the M1 metal layer 542 to form the tunnel barrier 1322, and can deposit the CE layer 1320, which also can be the desired superconducting material on the tunnel barrier 1322. The device formation component 306 can etch the CE layer 1320 down through the tunnel barrier 1322, which can define the junction, and that can be the CE for the Josephson junction. The device formation component 306 also can pattern or form the BE of the Josephson junction on the portion 1316 the M1 metal layer 542, and that BE can act as an interconnect level.

The third layer of the trilayer build can be the M2 metal layer 1308, where an air bridge for the Josephson junction can be formed. The device formation component 306 can complete the formation of the quantum circuit for the trilayer Josephson junction 1310 with an oxide fill, CMP, and deposition and patterning of an M2 metal layer 1308 (e.g., to form an air bridge) to form the trilayer Josephson junction 1310 and associated components and circuitry. There can be a desired coupling between the BE and CE under certain conditions regarding the operation of the Josephson junction 1310. The CE also can be conductively connected to the air bridge on M2 metal layer 1308. The portion 1318 of the M1 metal layer 542, the SOI layer portion 1314 of the SOI layer 504, and the M0 metal layer 524 can form the parallel plate shunt capacitor 1104 of the device 1100. The M2 air bridge can be conductively connected or coupled to the top plate (e.g., portion 1318 of the M1 metal layer 542) of the capacitor 1104, and the top plate can be coupled (e.g., capacitively coupled) to the bottom plate (e.g., the M0 metal layer 524) of the capacitor 1104. The M0 metal layer 524 also can be the bottom plate for a capacitor that can be formed by the M0 metal layer 524, the SOI layer portion 1312, and the BE (e.g., portion 1316 of the M1 metal layer 542), which can act as the top plate of that capacitor, wherein the BE can be coupled (e.g., capacitively coupled) to the bottom plate (e.g., M0 metal layer 524).

For completeness, as depicted in the first side cross-sectional view 1204 (A-A') of the qubit 1102, which can span across the open region 1324 depicted in the second side cross-sectional view 1306 (B-B') of the qubit 1102, the seal layer 538 can be bonded to the handle wafer 540, and the M0 metal layer 524 can be associated with the seal layer 538, such as described herein. A portion of the air bridge of the M2 metal layer 1308 can be suspended over the open region 1324 and the M0 metal layer 524.

Figure 14:
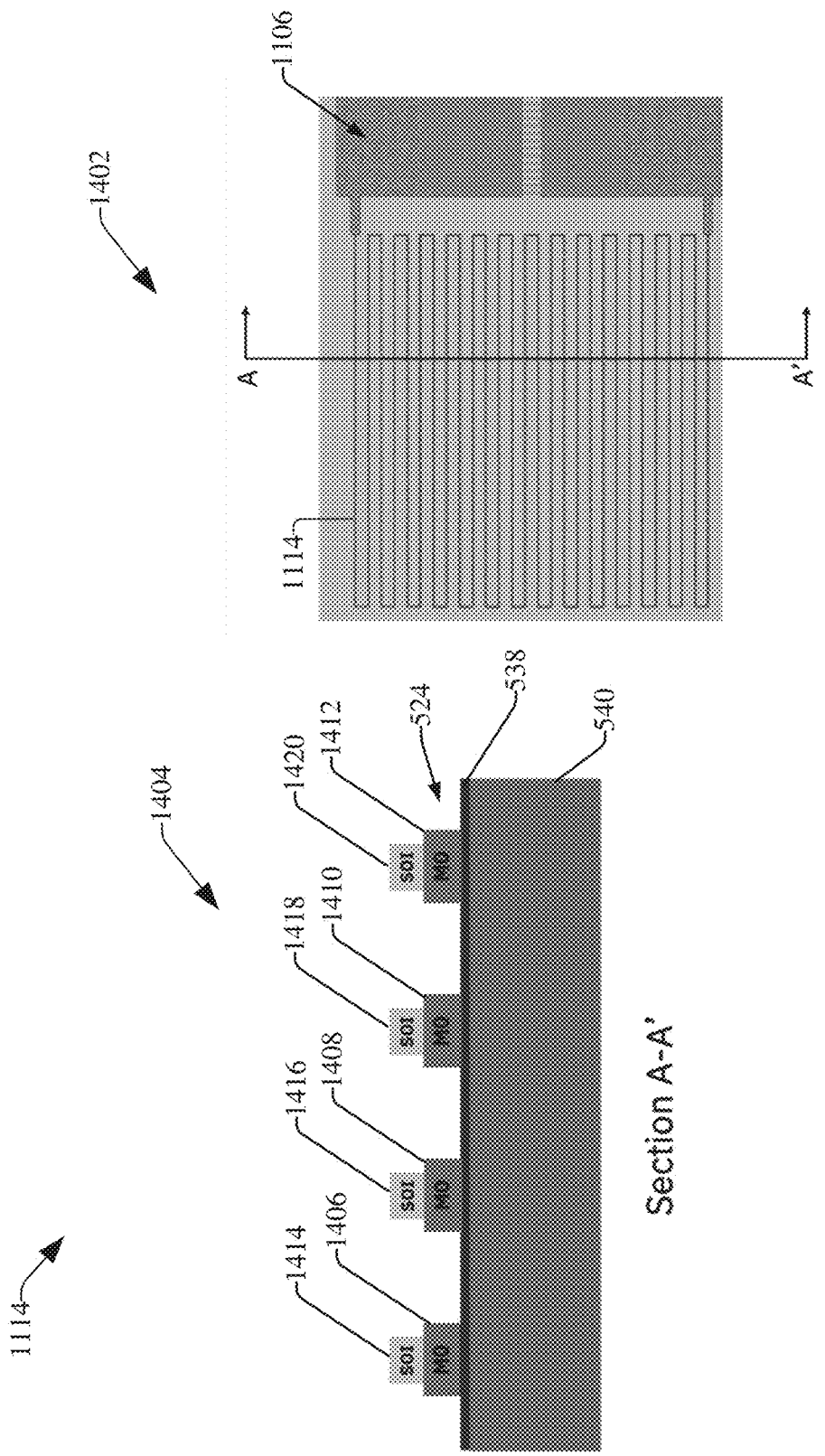
FIG. 14 illustrates diagrams of a top view and a side cross-sectional view of an example, non-limiting inductor of the device, in accordance with various aspects and embodiments of the disclosed subject matter.

Referring to FIG. 14, FIG. 14 illustrates diagrams of a top view and a side cross-sectional view of an example, non-limiting inductor 1114 of the device 1100, in accordance with various aspects and embodiments of the disclosed subject matter. The diagrams can comprise a top view 1402 and a side cross-sectional view 1404 (A-A'), of the inductor 1114. The top view 1402 of the inductor 1114 depicts the inductor 1114 being connected to the parallel plate capacitor 1106 (only a portion of the capacitor is depicted in FIG. 14) of the device 1100, such as described herein. As can be observed in the side cross-sectional view 1404 (A-A') of the inductor 1114, the seal layer 538 can be bonded to the handle wafer 540, and the M0 metal layer 524 can be associated with the seal layer 538, such as described herein. The device formation component 306 can pattern and/or form the windings of the inductor 1114 (e.g., discrete and/or meander type inductor), including windings 1406, 1408, 1410, and 1412, on, and as part of, the patterning of the M0 metal layer 524. In some embodiments, SOI caps, such as SOI caps 1414, 1416, 1418, and 1420, of the SOI layer 504 can respectively remain on the windings, such as the windings 1406, 1408, 1410, and 1412, as a residual of the quantum circuitry fabrication process 400. In some embodiments, the disclosed subject matter can merely allow those SOI caps (e.g., 1414, 1416, 1418, and 1420) to remain on the respective windings (e.g., 1406, 1408, 1410, and 1412), as those SOI caps typically can not negatively impact performance of the inductor 1114. If and as desired though, in other embodiments, as part of the quantum circuitry fabrication process 400, the device formation component 306 can remove (e.g., etch or polish away) the SOI caps from the windings (e.g., 1406, 1408, 1410, and 1412) of the inductor 1114.

Figure 15:
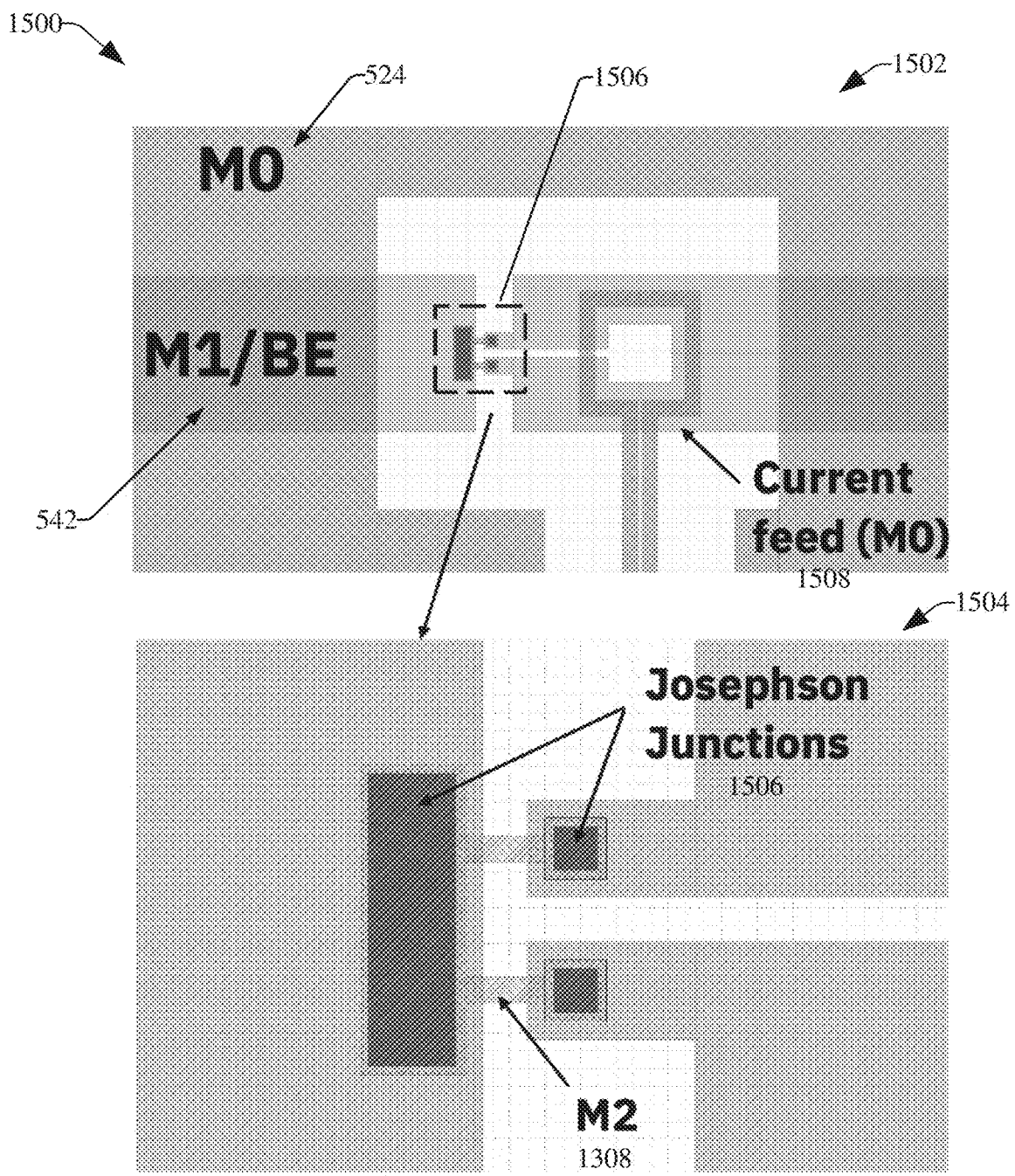
FIG. 15 depicts diagrams of a top view and an enlarged portional view of an example, non-limiting SQUID that can be employed with a qubit of a device, in accordance with various aspects and embodiments of the disclosed subject matter.

Turning to FIG. 15, FIG. 15 depicts diagrams of a top view and an enlarged portional view of an example, non-limiting SQUID 1500 that can be employed with a qubit (e.g., qubit 1102) of a device (e.g., quantum device), in accordance with various aspects and embodiments of the disclosed subject matter. The diagrams can comprise a top view 1502 of the SQUID 1500 and an enlarged portional view 1504 of the Josephson junctions 1506 of the SQUID 1500. The SQUID 1500 can be formed using, for example, the quantum circuitry fabrication process 400 and using the techniques of the disclosed subject matter, such as described herein.

The SQUID 1500 can comprise the Josephson junctions 1506 that can be formed across one or more metal layers (e.g., M1 metal layer 542, also referred to herein as the M1/BE layer, and/or the M2 metal layer 1308, which can comprise the air bridges), such as described herein. The M0 metal layer 524 can be associated with the SOI layer 504, and can be associated with (e.g., capacitively coupled to) certain portions of the M1 metal layer 542. In some embodiments, the device formation component 306 can form a desired current feed 1508 for the SQUID 1500 on the M0 metal layer 524 (e.g., by patterning the M0 metal layer 524 to form or pattern the current feed 1508), wherein the current feed can apply the desired current and magnetic field to the SQUID 1500 (e.g., to the SQUID loop). The disclosed subject matter, by employing the device formation component 306, the quantum circuitry fabrication process 400, and the techniques of the disclosed subject matter, can desirably (e.g., suitably, enhancedly, and/or optimally) achieve tight coupling between the current coil and the SQUID 1500, and the current coil leads of the current coil can be desirably well-shielded and low inductance, for example, when integrated multilevel wiring is utilized, such as described herein. Due to the radio frequency (RF) environment of devices, and noise in general, it can be desirable to manage the capacitive coupling between the current feed 1508 and the SQUID 1500. The techniques of the disclosed subject matter can be employed to achieve desirable management of the capacitive coupling between the current feed 1508 and the SQUID 1500 to mitigate any potential negative effects that can or may be caused by RF or noise.

The systems and/or devices have been (or will be) described herein with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 16:
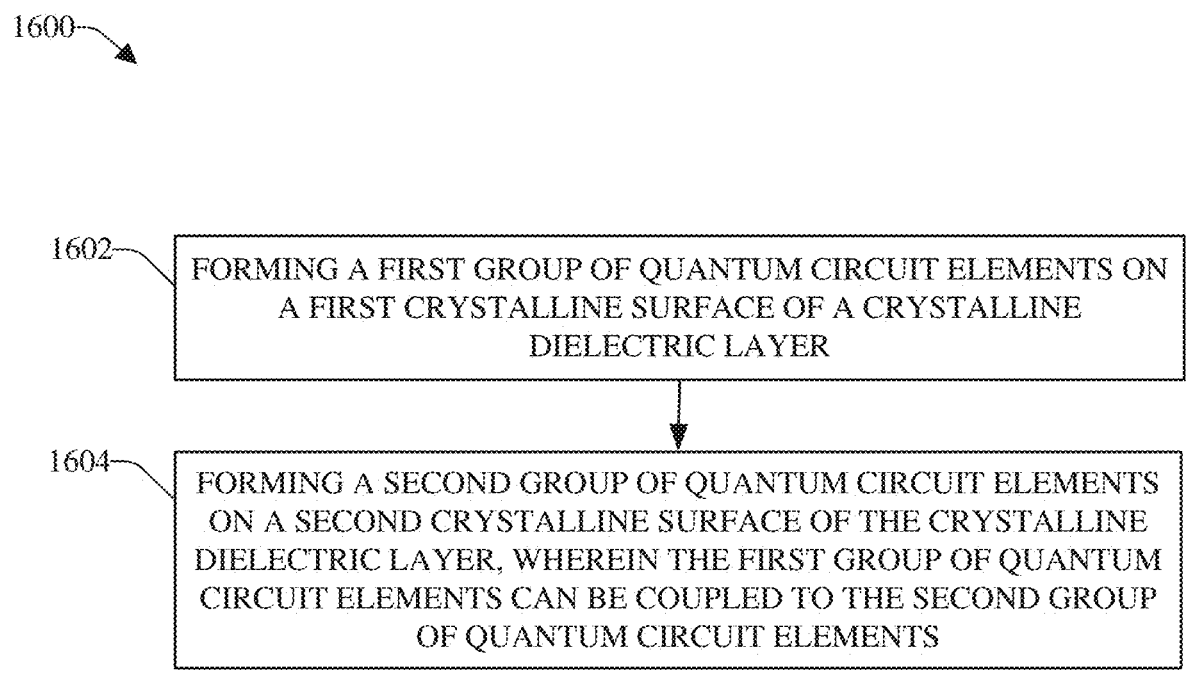
FIG. 16 illustrates a flow diagram of an example, non-limiting method that can form a device comprising respective groups of quantum circuit elements formed on respective crystalline surfaces of a crystalline dielectric layer, in accordance with various aspects and embodiments of the disclosed subject matter.

FIG. 16 illustrates a flow diagram of an example, non-limiting method 1600 that can form a device (e.g., quantum device, qubit device, or multi-qubit device) comprising respective groups of quantum circuit elements formed on respective crystalline surfaces of a crystalline dielectric layer, in accordance with various aspects and embodiments of the disclosed subject matter. The method 1600 can be performed by, for example, a system (e.g., computer system) comprising or operatively coupled to a device formation component, a processor component, and a memory. Repetitive description of like elements employed in other embodiments described herein is or may be omitted for sake of brevity.

At 1602, a first group of quantum circuit elements can be formed on a first crystalline surface of a CD layer. The device formation component can deposit a first metallization layer (e.g., superconducting material) on the first crystalline surface of the CD layer (e.g., SOI, SOS, GOI, or other suitable crystalline dielectric material). The device formation component can pattern and/or etch the first metallization layer (e.g., a desired superconducting material) to form the first group of quantum circuit elements on the first crystalline surface, such as described herein. The first group of quantum circuit elements can comprise, for example, a qubit(s), a Josephson junction(s) of a qubit, a SQUID loop(s), a capacitor(s), an inductor(s), a resonator(s), and/or microstrip lines, or portions thereof (e.g., elements of a qubit; or an element, such as a plate, of a capacitor), and/or other circuitry (e.g., connectors or lead lines, interconnects, electrodes, or other desired circuitry).

At 1604, a second group of quantum circuit elements can be formed on a second crystalline surface of the CD layer, wherein the first group of quantum circuit elements can be coupled to the second group of quantum circuit elements. The device formation component can deposit a second metallization layer (e.g., a desired superconducting material) on the second crystalline surface of the CD layer. The device formation component can pattern and/or etch the second metallization layer to form the second group of quantum circuit elements on the second crystalline surface, such as described herein. The second crystalline surface can be on the opposite side of the CD layer from the first crystalline surface. In some embodiments, the second group of quantum circuit elements can comprise interconnects, connectors or lead lines, and/or other circuitry. In certain embodiments, in addition or alternatively, the second group of quantum circuit elements can comprise a qubit(s), a Josephson junction(s) of a qubit, a SQUID loop(s), a capacitor(s), an inductor(s), a resonator(s), and/or microstrip lines, or portions thereof (e.g., elements of a qubit; or an element, such as a plate, of a capacitor). In certain embodiments, the device formation component can form (e.g., etch) the one or more vias in the CD layer to facilitate forming interconnects (e.g., superconducting interconnects) that can span from the first crystalline surface to the second crystalline surface, which can enable electrical access of both sides of the CD layer. Using the vias (e.g., by depositing superconductive material into the vias), the device formation component can form desired interconnects between certain quantum circuit elements of the first group of quantum circuit elements formed on the first crystalline surface and certain other quantum circuit elements of the second group of quantum circuit elements formed on the second crystalline surface.

In some embodiments, the device formation component can first form the second group of quantum circuit elements on the second crystalline surface of the CD layer. Subsequently, the device formation component can apply a seal layer to the second (patterned) metallization layer (or a top (patterned) metallization layer, if there is more than one metallization layer on that side of the CD layer, and can bond a handle wafer to the seal layer. The chip stack can be turned over to place the substrate at the top of the chip stack and the handle wafer at the bottom of the chip stack, such as described herein. The device formation component can remove (e.g., grind, etch, polish, or otherwise remove) the substrate to expose a BOX layer, and remove the BOX layer to expose the first crystalline surface of the CD layer, such as described herein. The device formation component can deposit the first metallization layer on the first surface of the CD layer (and/or one or more other metallization layers and one or more associated dielectric layers, between each metallization layer, on top of the first metallization layer), and can pattern and/or etch the first metallization layer to form the first group of quantum circuit elements on the first crystalline surface.

Figure 17:
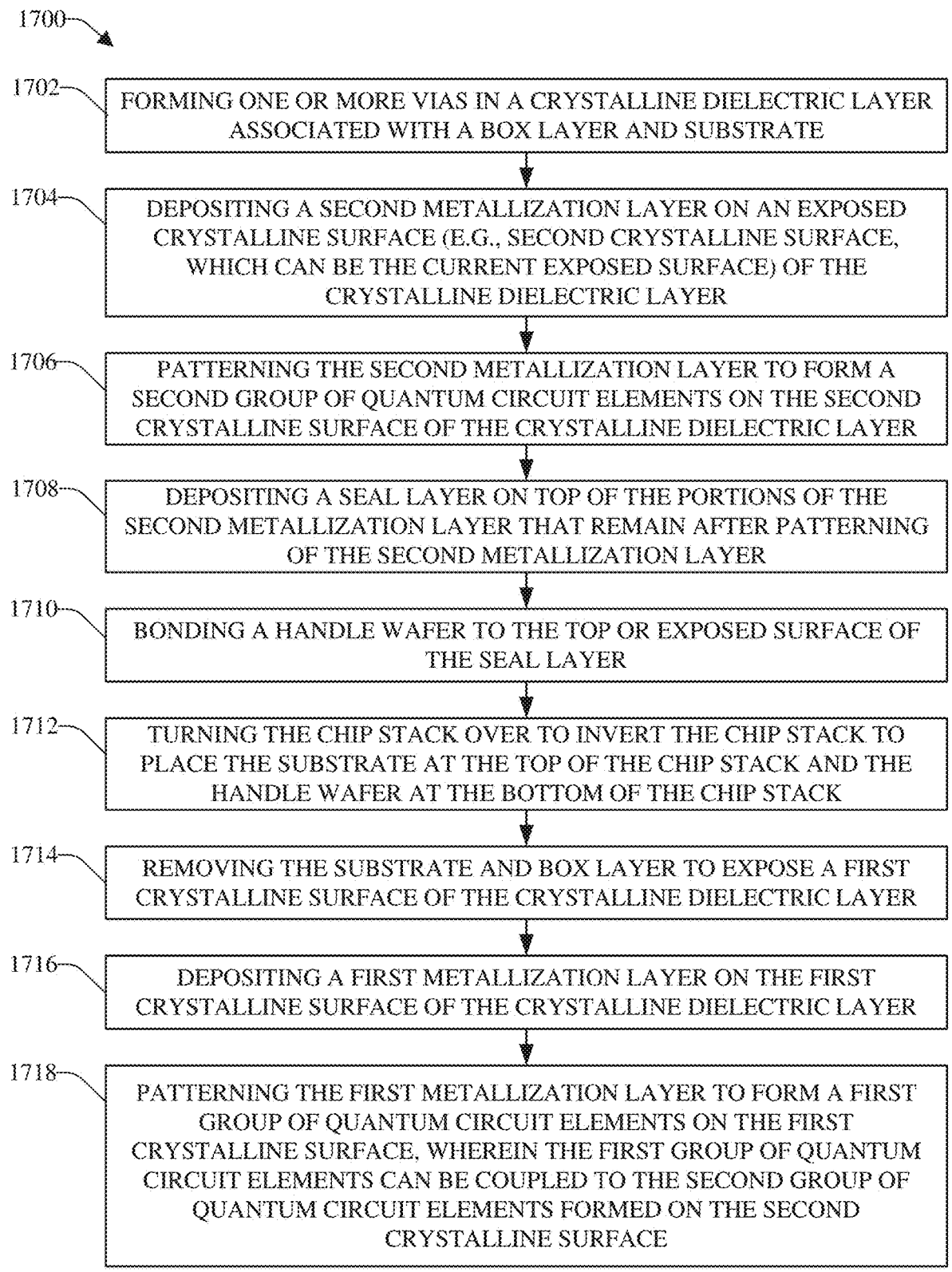
FIG. 17 depicts a flow diagram of another example, non-limiting method that can form a device comprising respective groups of quantum circuit elements formed on respective crystalline surfaces of a crystalline dielectric layer, in accordance with various aspects and embodiments of the disclosed subject matter.

FIG. 17 depicts a flow diagram of another example, non-limiting method 1700 that can form a device (e.g., quantum device, qubit device, or multi-qubit device) comprising respective groups of quantum circuit elements formed on respective crystalline surfaces of a CD layer, in accordance with various aspects and embodiments of the disclosed subject matter. The method 1700 can be performed by, for example, a system (e.g., computer system) comprising or operatively coupled to a device formation component, a processor component, and a memory. Repetitive description of like elements employed in other embodiments described herein is or may be omitted for sake of brevity. In some embodiments, an initial chip stack can comprise a substrate with a BOX layer formed or deposited on top of the substrate, and a CD layer formed or fabricated on the top of the BOX layer, such as described herein.

At 1702, one or more vias can be formed in the CD layer associated with the BOX layer and substrate. The device formation component can form (e.g., etch) the one or more vias in the CD layer down to and stopping at the BOX layer. In some embodiments, the device formation component can employ an RIE process to etch the one or more vias, although, in other embodiments, another desired etching process or via formation process can be utilized to etch or otherwise form the one or more vias. Forming the one or more vias in the CD layer can enable electrical access of both sides of the CD layer. In certain embodiments, the disclosed subject matter can employ protective layers and/or protective processes to facilitate protecting the surfaces of the CD layer, including protecting CD surfaces in connection with the forming of the one or more vias, such as described herein.

At 1704, a second metallization layer can be deposited on an exposed crystalline surface (e.g., second crystalline surface, which can be the current exposed surface) of the CD layer. The device formation component can deposit the second metallization layer (e.g., a desired superconducting material) on the exposed crystalline surface (e.g., second crystalline surface) of the CD layer, such as described herein. The method 1700 will comprise depositing a first metallization layer to the other side of the CD layer, as described herein. It is to be appreciated and understood that, in accordance with various embodiments, if and as desired, one or more additional metallization layers can be added (e.g., deposited) on top of this second metallization layer on this side of the CD layer with dielectric layers in between the metallization layers, such as described herein.

At 1706, the second metallization layer can be patterned to form a second group of quantum circuit elements on the exposed crystalline surface of the CD layer. The device formation component can pattern and/or etch the second metallization layer to form the second group of quantum circuit elements on the second (e.g., currently exposed) crystalline surface of the CD layer, such as described herein.

At 1708, a seal layer can be deposited on top of the portions of the second metallization layer that remain after patterning of the second metallization layer. The device formation component can deposit the seal layer on top of the portions of the second metallization layer that remain after patterning (and on top of oxide material deposited in gaps formed in the second metallization layer by the patterning), such as described herein. In other embodiments, the disclosed subject matter can omit, such a seal layer, such as described herein.

At 1710, a handle wafer can be bonded to the top or exposed surface of the seal layer. The device formation component can bond the handle wafer to the top or exposed surface of the seal layer using a desired bonding process and/or bonding material. In accordance with various embodiments, the device formation component can utilize an adhesive bond, metal-metal bond, or oxide-oxide bond to bond the handle wafer to the top or exposed surface of the seal layer. If no seal layer is utilized the device formation component can bond the handle wafer to the second metallization layer, as patterned, and associated chip stack using a desired bond (e.g., metal-metal bond or oxide-oxide bond), such as described herein.

At 1712, the chip stack can be turned over to invert the chip stack to place the substrate at the top of the chip stack and the handle wafer at the bottom of the chip stack. The device formation component or other component can turn over (e.g., flip over) the chip stack, comprising the handle wafer, seal layer, second patterned metallization layer comprising second group of quantum circuit elements, CD layer, BOX layer, and substrate, to invert the chip stack to place the substrate at the top, and the handle wafer at the bottom, of the chip stack.

At 1714, the substrate and BOX layer can be removed to expose a first crystalline surface of the CD layer. The device formation component can remove (e.g., etch, grind, or polish) the substrate and BOX layer from the chip stack to expose the first crystalline surface of the CD layer that is on the opposite side of the CD layer from the second crystalline surface.

At 1716, a first metallization layer can be deposited on the first crystalline surface of the CD layer. The device formation component can deposit the first metallization layer (e.g., a desired superconducting material) on first crystalline surface (e.g., the currently exposed crystalline surface) of the CD layer, such as described herein. It is to be appreciated and understood that, in accordance with various embodiments, if and as desired, one or more additional metallization layers can be added (e.g., deposited) on top of this first metallization layer on this side of the CD layer with dielectric layers in between the metallization layers, such as described herein.

At 1718, the first metallization layer can be patterned to form a first group of quantum circuit elements on the first crystalline surface of the CD layer, wherein the first group of quantum circuit elements can be coupled to the second group of quantum circuit elements formed on the second crystalline surface of the CD layer. The device formation component can pattern and/or etch the first metallization layer to form the first group of quantum circuit elements on the first crystalline surface of the CD layer, such as described herein. In some embodiments, the device formation component can perform further processing on the chip stack, for example, to remove any oxide material that may remain in gaps or vias that were formed in the CD layer, first metallization layer, and/or second metallization layer to facilitate creating open regions in the gaps or vias that can be utilized, as desired, to facilitate forming the desired quantum circuitry. The device formation component also can couple or interconnect the first group of quantum circuit elements on the first crystalline surface of the CD layer to the second group of quantum circuit elements formed on the second crystalline surface of the CD layer.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 18:
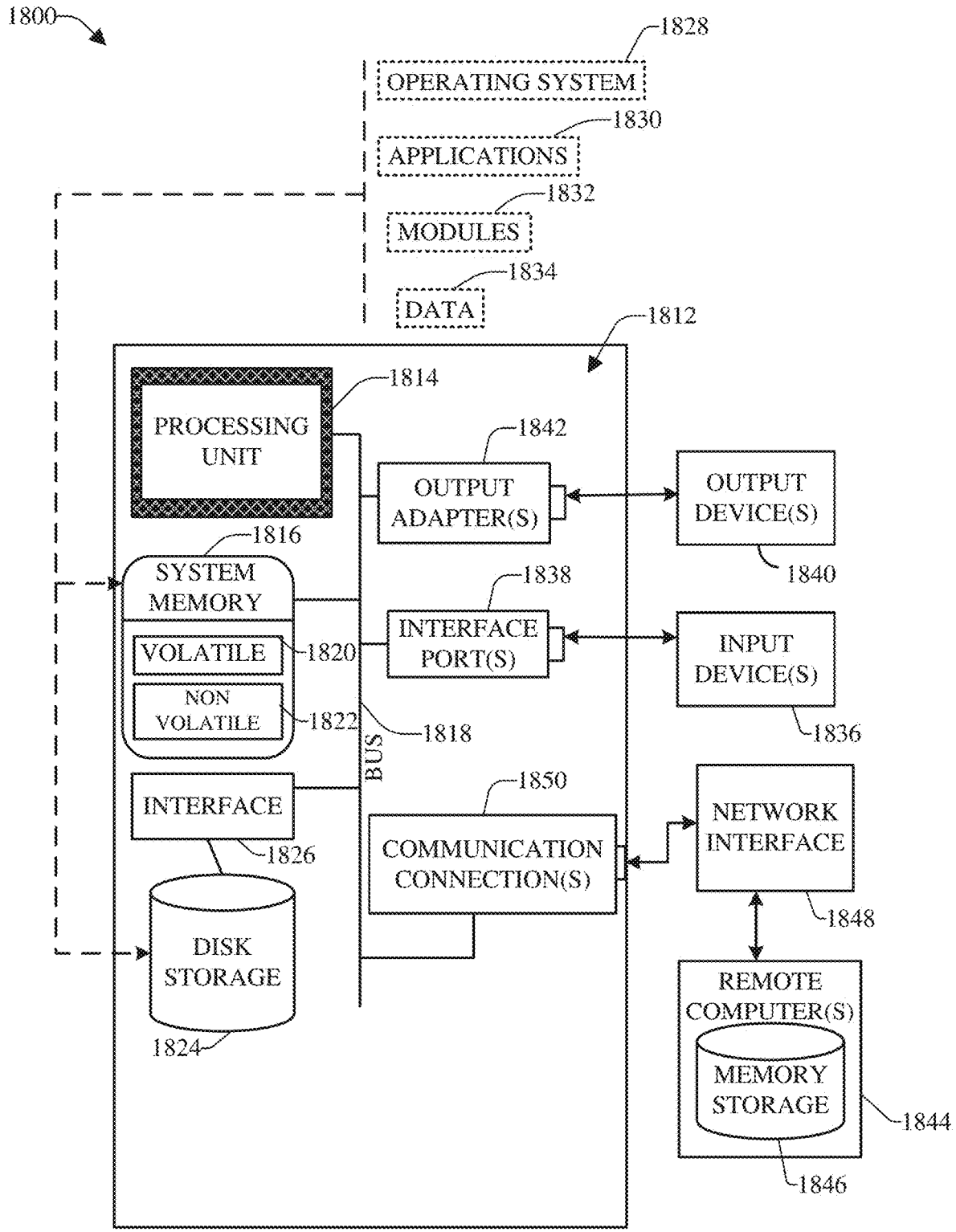
FIG. 18 illustrates a block diagram of an example, non-limiting operating environment in which one or more embodiments described herein can be facilitated.

In order to provide a context for the various aspects of the disclosed subject matter, FIG. 18 as well as the following discussion are intended to provide a general description of a suitable environment in which the various aspects of the disclosed subject matter can be implemented. FIG. 18 illustrates a block diagram of an example, non-limiting operating environment in which one or more embodiments described herein can be facilitated. Repetitive description of like elements employed in other embodiments described herein is or may be omitted for sake of brevity. With reference to FIG. 18, a suitable operating environment 1800 for implementing various aspects of this disclosure can also include a computer 1812. The computer 1812 can also include a processing unit 1814, a system memory 1816, and a system bus 1818. The system bus 1818 couples system components including, but not limited to, the system memory 1816 to the processing unit 1814. The processing unit 1814 can be any of various available processors. Dual microprocessors and other multiprocessor architectures also can be employed as the processing unit 1814. The system bus 1818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1816 can also include volatile memory 1820 and nonvolatile memory 1822. The basic input/output system (BIOS), containing the basic routines to transfer information between elements within the computer 1812, such as during start-up, is stored in nonvolatile memory 1822. By way of illustration, and not limitation, nonvolatile memory 1822 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1820 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM).

Computer 1812 can also include removable/non-removable, volatile/non-volatile computer storage media. FIG. 18 illustrates, for example, a disk storage 1824. Disk storage 1824 can also include, but is not limited to, devices like a magnetic disk drive, floppy disk drive, tape drive, Jaz drive, Zip drive, LS-100 drive, flash memory card, or memory stick. The disk storage 1824 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1824 to the system bus 1818, a removable or non-removable interface is typically used, such as interface 1826. FIG. 18 also depicts software that acts as an intermediary between users and the basic computer resources described in the suitable operating environment 1800. Such software can also include, for example, an operating system 1828. Operating system 1828, which can be stored on disk storage 1824, acts to control and allocate resources of the computer 1812. System applications 1830 take advantage of the management of resources by operating system 1828 through program modules 1832 and program data 1834, e.g., stored either in system memory 1816 or on disk storage 1824. It is to be appreciated that this disclosure can be implemented with various operating systems or combinations of operating systems. A user enters commands or information into the computer 1812 through input device(s) 1836. Input devices 1836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1814 through the system bus 1818 via interface port(s) 1838. Interface port(s) 1838 include, for example, a serial port, a parallel port, a game port, and a universal serial bus (USB). Output device(s) 1840 use some of the same type of ports as input device(s) 1836. Thus, for example, a USB port can be used to provide input to computer 1812, and to output information from computer 1812 to an output device 1840. Output adapter 1842 is provided to illustrate that there are some output devices 1840 like monitors, speakers, and printers, among other output devices 1840, which require special adapters. The output adapters 1842 include, by way of illustration and not limitation, video and sound cards that provide a method of connection between the output device 1840 and the system bus 1818. It should be noted that other devices and/or systems of devices provide both input and output capabilities such as remote computer(s) 1844.

Computer 1812 can operate in a networked environment using logical connections to one or more remote computers, such as remote computer(s) 1844. The remote computer(s) 1844 can be a computer, a server, a router, a network PC, a workstation, a microprocessor based appliance, a peer device or other common network node and the like, and typically can also include many or all of the elements described relative to computer 1812. For purposes of brevity, only a memory storage device 1846 is illustrated with remote computer(s) 1844. Remote computer(s) 1844 is logically connected to computer 1812 through a network interface 1848 and then physically connected via communication connection 1850. Network interface 1848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1850 refers to the hardware/software employed to connect the network interface 1848 to the system bus 1818. While communication connection 1850 is shown for illustrative clarity inside computer 1812, it can also be external to computer 1812. The hardware/software for connection to the network interface 1848 can also include, for exemplary purposes only, internal and external technologies such as, modems including regular telephone grade modems, cable modems and DSL modems, ISDN adapters, and Ethernet cards.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can include the following: a portable computer diskette, a hard disk, a RAM, a ROM, an erasable programmable read-only memory (EPROM or Flash memory), a SRAM, a portable CD-ROM, a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include ROM, PROM, EPROM, EEPROM, flash memory, or nonvolatile RAM (e.g., FeRAM). Volatile memory can include RAM, which can act as external cache memory, for example. By way of illustration and not limitation, RAM is available in many forms such as SRAM, DRAM, SDRAM, DDR SDRAM, ESDRAM, SLDRAM, DRRAM, DRDRAM, and RDRAM. Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first group of quantum circuit elements on a first crystalline surface of a crystalline dielectric layer;
   a second group of quantum circuit elements on a second crystalline surface of the crystalline dielectric layer, wherein the first group of quantum circuit elements is coupled to the second group of quantum circuit elements;
   a capacitor, wherein the first group of quantum circuit elements comprises a first plate of the capacitor, wherein the second group of quantum circuit elements comprises a second plate of the capacitor, wherein the crystalline dielectric layer is situated between the first plate and the second plate, wherein the first crystalline surface interfaces with the first plate, wherein the second crystalline surface interfaces with the second plate, and wherein the first plate is coupled to the second plate;
   a qubit, comprising:
      a Josephson junction, and
      a shunt capacitor associated with the Josephson junction;
   a resonator, comprising:
      the capacitor, wherein the capacitor is associated with the qubit via a capacitive coupler component, and
      an inductor that is associated with the capacitor; and
   microstrip signal lines associated with the capacitor, wherein at least one of the Josephson junction, the capacitor, the shunt capacitor, the inductor, or the microstrip signal lines is comprised of a superconducting material, and wherein quantum circuit elements of the first group of quantum circuit elements or the second group of quantum circuit elements are part of at least one of the qubit, the Josephson junction, the shunt capacitor, the capacitor, the inductor, or the microstrip signal lines.

2. The device of claim 1, wherein the first crystalline surface is on a first side of the crystalline dielectric layer, and wherein the second crystalline surface is on a second side of the crystalline dielectric layer that is opposite of the first side of the crystalline dielectric layer.

3. The device of claim 1, wherein the crystalline dielectric layer is a silicon-on-insulator layer, a silicon-on-sapphire layer, or a germanium-on-insulator layer.

4. The device of claim 1, wherein the first group of quantum circuit elements and the second group of quantum circuit elements are comprised of a superconducting material, and wherein the first group of quantum circuit elements is coupled or interconnected to the second group of quantum circuit elements.

5. The device of claim 4, further comprising a handle wafer associated with the second group of quantum circuit elements or a seal layer that is associated with the second group of quantum circuit elements.

6. The device of claim 1, wherein the crystalline dielectric layer is a low loss tangent dielectric that satisfies a defined low loss tangent criterion.

7. The device of claim 1, wherein the qubit, the capacitor, the inductor, and the microstrip signal lines are situated or integrated on a single die.

8. The device of claim 1, wherein the Josephson junction is a trilayer Josephson junction or a Dolan bridge Josephson junction, and wherein the first group of quantum circuit elements comprises quantum circuit elements that are part of the trilayer Josephson junction or the Dolan bridge Josephson junction.

9. The device of claim 1, further comprising a superconducting-quantum-interference-device loop circuit coupled to the qubit or a bus connecting multiple qubits comprising the qubit.

10. A method, comprising:
    forming a first group of quantum circuit elements on a first crystalline surface of a crystalline dielectric layer; and
    forming a second group of quantum circuit elements on a second crystalline surface of the crystalline dielectric layer, wherein the first group of quantum circuit elements is coupled to the second group of quantum circuit elements,
    wherein forming the second group of quantum circuit elements comprises:
       forming a group of vias in the crystalline dielectric layer, wherein the crystalline dielectric layer is on a buried oxide layer that is on a substrate of a chip stack,
       depositing a metallization layer on the second crystalline surface of the crystalline dielectric layer,
       patterning the metallization layer to form the second group of quantum circuit elements on the second crystalline surface, and
       bonding a handle wafer to the second group of quantum circuit elements or a seal layer deposited on the second group of quantum circuit elements, wherein the bonding is a metal-metal bonding, an oxide-oxide bonding, or an adhesive bonding, and
    wherein forming the first group of quantum circuit elements comprises:
       after bonding the handle wafer, turning the chip stack over to invert the chip stack to place the substrate at a top end of the chip stack and the handle wafer at a bottom end of the chip stack, and
       removing the substrate and the buried oxide layer from the chip stack to expose the first crystalline surface of the crystalline dielectric layer.

11. The method of claim 10, wherein the first crystalline surface is on a first side of the crystalline dielectric layer, and wherein the second crystalline surface is on a second side of the crystalline dielectric layer that is opposite of the first side of the crystalline dielectric layer.

12. The method of claim 10, wherein the metallization layer is a second metallization layer, and wherein forming the first group of quantum circuit elements further comprises:
    depositing a first metallization layer on the first crystalline surface of the crystalline dielectric layer; and
    patterning the first metallization layer to form the first group of quantum circuit elements on the first crystalline surface, wherein a first portion of the first group of quantum circuit elements is coupled or interconnected to a second portion of the second group of quantum circuit elements.

13. The method of claim 10, wherein quantum circuit elements of the first group of quantum circuit elements or the second group of quantum circuit elements form at least one of a qubit, a Josephson junction, a shunt capacitor, a capacitor, an inductor, a superconducting-quantum-interference-device loop circuit, an electrode, an interconnect, or microstrip signal lines.

14. A system, comprising:
a first group of quantum circuit elements situated on a first crystalline surface of a crystalline dielectric layer;
a second group of quantum circuit elements situated on a second crystalline surface of the crystalline dielectric layer, wherein the first group of quantum circuit elements is coupled to the second group of quantum circuit elements;
a capacitor, wherein the first group of quantum circuit elements comprises a first plate of the capacitor, wherein the second group of quantum circuit elements comprises a second plate of the capacitor, wherein the crystalline dielectric layer is situated between the first plate and the second plate, wherein the first crystalline surface interfaces with the first plate, wherein the second crystalline surface interfaces with the second plate, and wherein the first plate is coupled to the second plate;
a qubit, comprising:
a Josephson junction, and
a shunt capacitor associated with the Josephson junction;
a resonator, comprising:
the capacitor, wherein the capacitor is associated with the qubit via a capacitive coupler component, and
an inductor that is associated with the capacitor; and
microstrip signal lines associated with the capacitor, wherein at least one of the Josephson junction, the capacitor, the shunt capacitor, the inductor, or the microstrip signal lines is comprised of a superconducting material, and wherein quantum circuit elements of the first group of quantum circuit elements or the second group of quantum circuit elements are part of at least one of the qubit, the Josephson junction, the shunt capacitor, the capacitor, the inductor, or the microstrip signal lines.

15. The system of claim 14, wherein the first group of quantum circuit elements and the second group of quantum circuit elements are comprised of a superconducting material, and wherein the first group of quantum circuit elements is coupled or interconnected to the second group of quantum circuit elements.

16. The system of claim 14, further comprising a handle wafer associated with the second group of quantum circuit elements or a seal layer that is associated with the second group of quantum circuit elements.

17. The system of claim 14, wherein the first crystalline surface is on a first side of the crystalline dielectric layer, and wherein the second crystalline surface is on a second side of the crystalline dielectric layer that is opposite of the first side of the crystalline dielectric layer.

18. The system of claim 14, wherein the crystalline dielectric layer is a silicon-on-insulator layer, a silicon-on-sapphire layer, or a germanium-on-insulator layer.

19. The system of claim 14, wherein the Josephson junction is a trilayer Josephson junction or a Dolan bridge Josephson junction, and wherein the first group of quantum circuit elements comprises quantum circuit elements that are part of the trilayer Josephson junction or the Dolan bridge Josephson junction.

20. The system of claim 14, further comprising a superconducting-quantum-interference-device loop circuit coupled to the qubit or a bus connecting multiple qubits comprising the qubit.

* * * * *